(12) United States Patent
Bando et al.

(10) Patent No.: US 11,903,226 B2
(45) Date of Patent: Feb. 13, 2024

(54) PHOTOELECTRIC CONVERSION ELEMENT AND IMAGING DEVICE

(71) Applicant: SONY GROUP CORPORATION, Tokyo (JP)

(72) Inventors: Masashi Bando, Kanagawa (JP); Michinori Shiomi, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/156,712

(22) Filed: Jan. 19, 2023

(65) Prior Publication Data

US 2023/0165020 A1 May 25, 2023

Related U.S. Application Data

(63) Continuation of application No. 16/964,010, filed as application No. PCT/JP2019/001258 on Jan. 17, 2019, now Pat. No. 11,581,370.

(30) Foreign Application Priority Data

Jan. 31, 2018 (JP) ................................. 2018-015406

(51) Int. Cl.
*H01L 27/146* (2006.01)
*H10K 39/32* (2023.01)
(Continued)

(52) U.S. Cl.
CPC ............. *H10K 39/32* (2023.02); *H10K 30/35* (2023.02); *H10K 30/82* (2023.02); *H10K 30/87* (2023.02)

(58) Field of Classification Search
CPC ........ H10K 39/32; H10K 30/35; H10K 30/82; H10K 30/87; Y02E 10/549;
(Continued)

(56) References Cited

U.S. PATENT DOCUMENTS 9,099,663 B1 8/2015 Chuang et al.
10,038,022 B1 * 7/2018 Chen ................. H01L 27/14623
(Continued)

FOREIGN PATENT DOCUMENTS

CN 107146850 A 9/2017
CN 108137323 A 6/2018
(Continued)

OTHER PUBLICATIONS

International Search Report and Written Opinion of PCT Application No. PCT/JP2019/001258, dated Apr. 16, 2019, 12 pages of ISRWO.

(Continued)

*Primary Examiner* — Samuel Park
(74) *Attorney, Agent, or Firm* — CHIP LAW GROUP

(57) ABSTRACT

A photoelectric conversion element includes a first electrode including a plurality of electrodes independent from each other, a second electrode disposed to be opposed to the first electrode, an n-type photoelectric conversion layer including a semiconductor nanoparticle, and a semiconductor layer including an oxide semiconductor material. The semiconductor layer is provided between the first electrode and the n-type photoelectric conversion layer. The n-type photoelectric conversion layer is provided between the first electrode and the second electrode. A carrier density of the n-type photoelectric conversion layer is higher than a carrier density of the semiconductor layer.

15 Claims, 20 Drawing Sheets

(51) Int. Cl.
*H10K 30/35* (2023.01)
*H10K 30/82* (2023.01)
*H10K 30/87* (2023.01)

(58) Field of Classification Search
CPC ......... H01L 27/14694; H01L 27/14612; H01L 27/14623; H01L 27/14665; H01L 31/10; H04N 25/70

See application file for complete search history.

(56) References Cited

U.S. PATENT DOCUMENTS

| | | | |
|---|---|---|---|
| 2015/0179840 A1* | 6/2015 | Watanabe | H01L 31/022475 |
| | | | 257/459 |
| 2016/0293783 A1* | 10/2016 | Shiomi | H01L 21/02562 |
| 2017/0018669 A1* | 1/2017 | Williams | H01L 31/1876 |
| 2017/0162616 A1* | 6/2017 | Tashiro | H01L 27/14605 |
| 2017/0170238 A1* | 6/2017 | Lee | H01L 27/14685 |
| 2017/0170239 A1 | 6/2017 | Lee et al. | |
| 2018/0175102 A1 | 6/2018 | Togashi et al. | |
| 2020/0075265 A1 | 3/2020 | Hosokawa et al. | |

FOREIGN PATENT DOCUMENTS

| | | | | |
|---|---|---|---|---|
| EP | 3087591 A1 | 11/2016 | | |
| EP | 3328791 A1 | 6/2018 | | |
| EP | 3424089 A1 | 1/2019 | | |
| FR | 3039531 A1 | 2/2017 | | |
| JP | 2010-177392 A | 8/2010 | | |
| JP | 2015-128105 A | 7/2015 | | |
| JP | 2017-157816 A | 9/2017 | | |
| JP | 2018-524820 A | 8/2018 | | |
| KR | 10-2017-0070693 A | 6/2017 | | |
| KR | 10-2018-0033536 A | 4/2018 | | |
| KR | 10-2018-0121330 A | 11/2018 | | |
| TW | 201526218 A | 7/2015 | | |
| WO | 2015/098048 A1 | 7/2015 | | |
| WO | 2015/163929 A1 | 10/2015 | | |
| WO | 2017/017238 A1 | 2/2017 | | |
| WO | 2017/150540 A1 | 9/2017 | | |
| WO | 2017/165594 A1 | 9/2017 | | |
| WO | WO-2017165594 A1 * | 9/2017 | ........... | G06F 3/0412 |
| WO | 2018/163327 A1 | 9/2018 | | |
| WO | WO-2018163327 A1 * | 9/2018 | ........... | H01G 9/0036 |

OTHER PUBLICATIONS

International Search Report and Written Opinion of PCT Application No. PCT/JP2019/001258, dated Aug. 13, 2020, 10 pages of English Translation and 09 pages of ISRWO.

Non-Final Office Action for U.S. Appl. No. 16/964,010, dated Mar. 3, 2022, 17 pages.

Final Office Action for U.S. Appl. No. 16/964,010, dated Aug. 18, 2022, 19 pages.

Notice of Allowance for U.S. Appl. No. 16/964,010, dated Oct. 14, 2022, 8 pages.

* cited by examiner

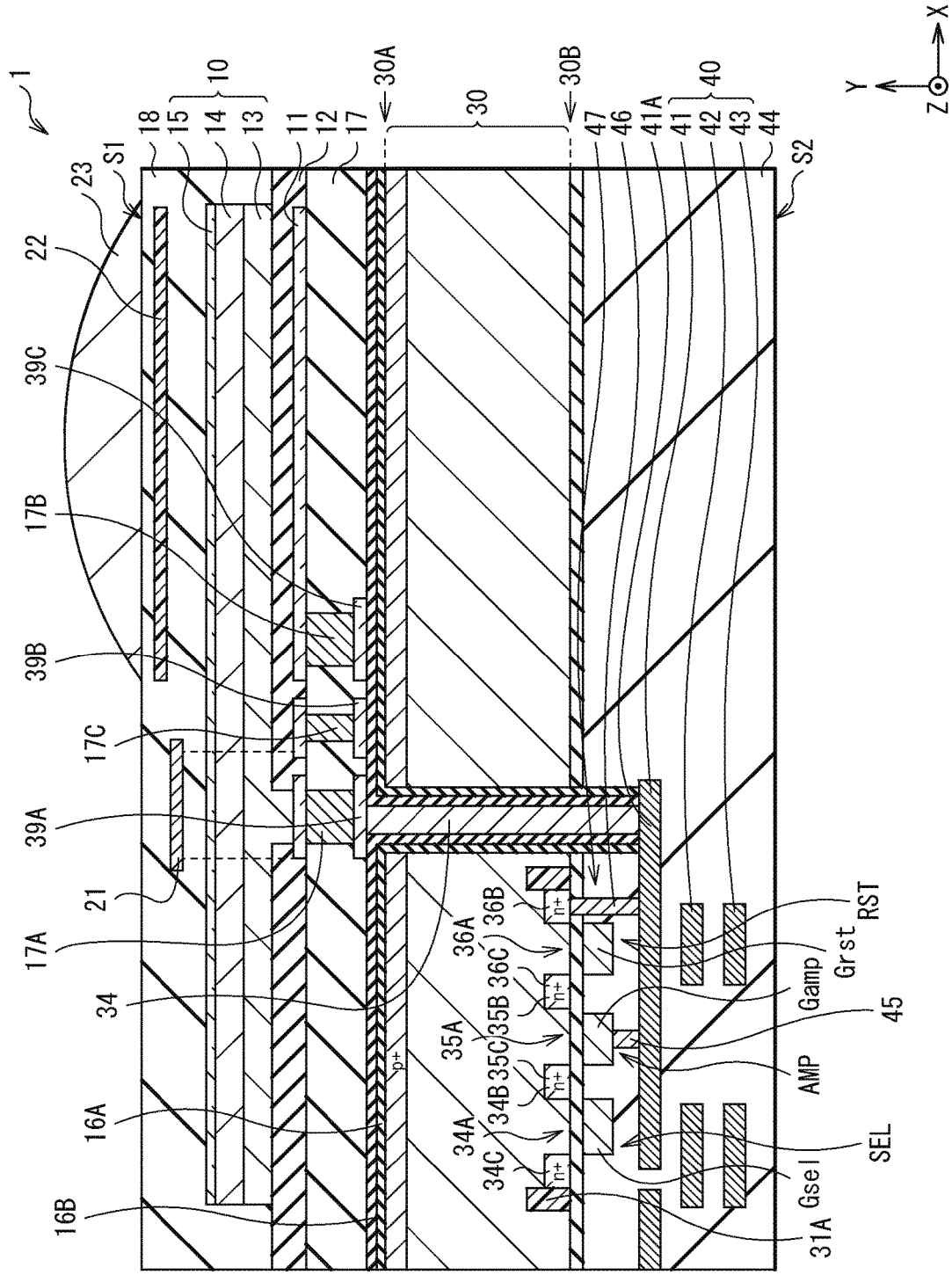

[FIG. 2]
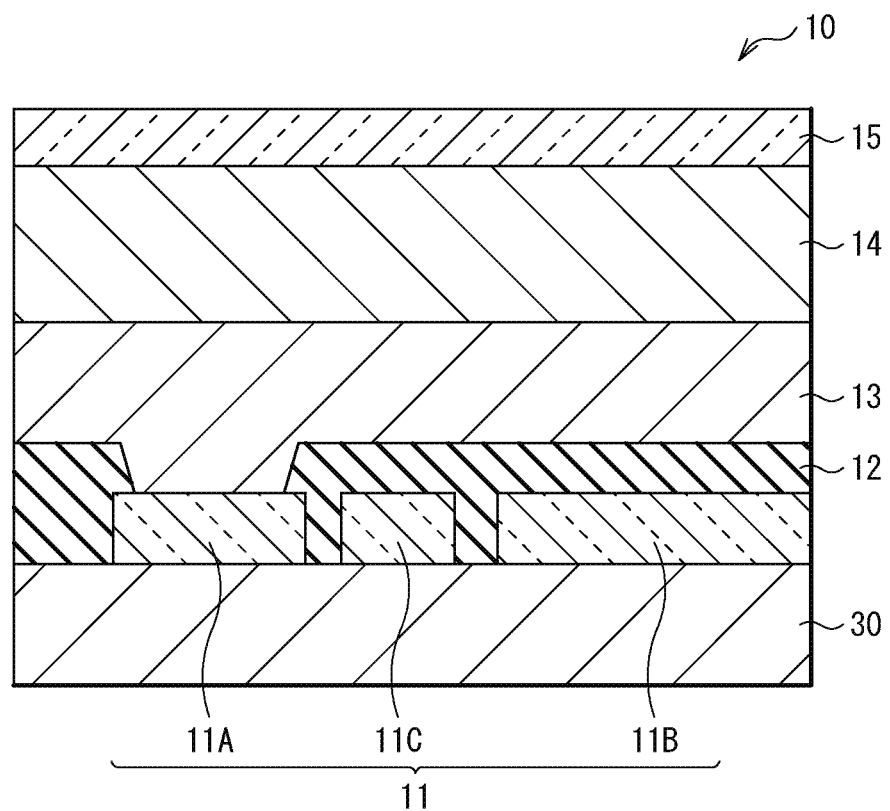

[FIG. 3]
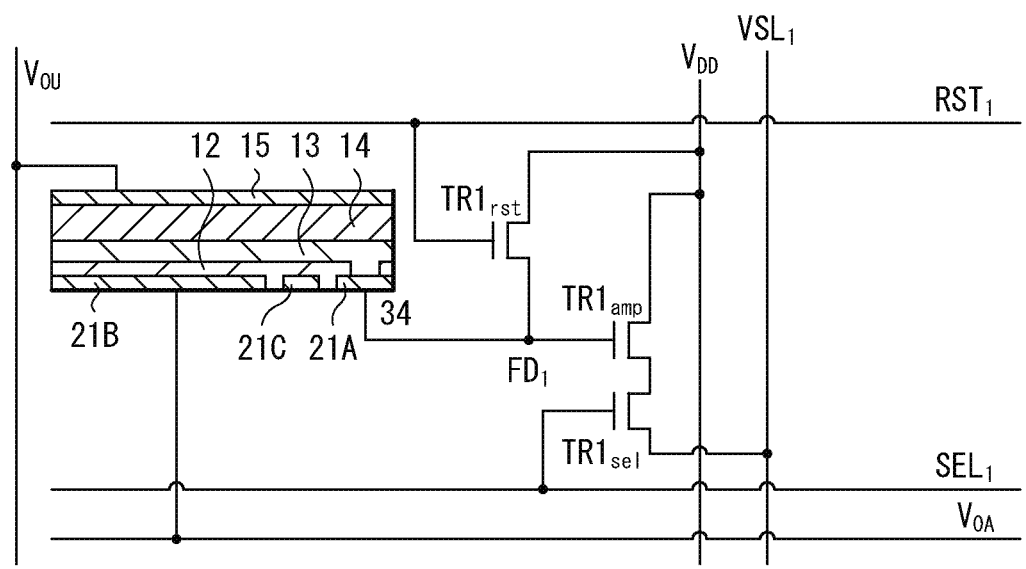

[FIG. 4]
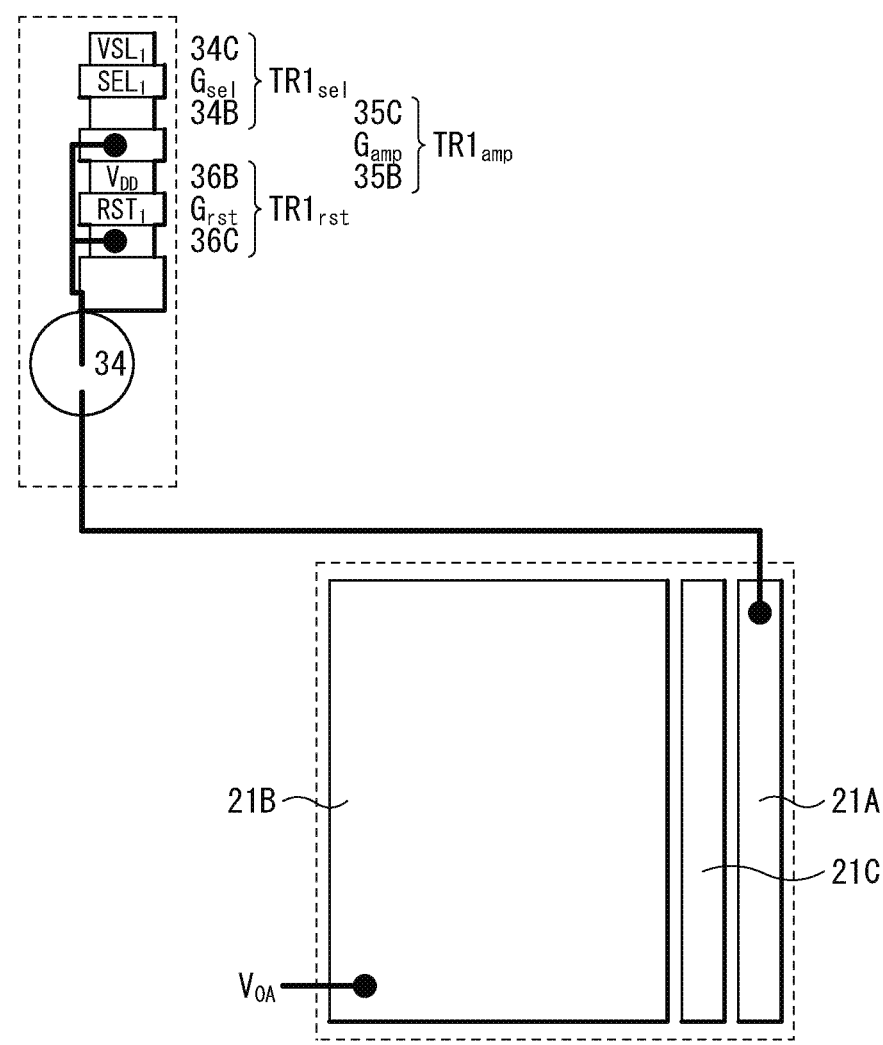

[FIG. 5A]
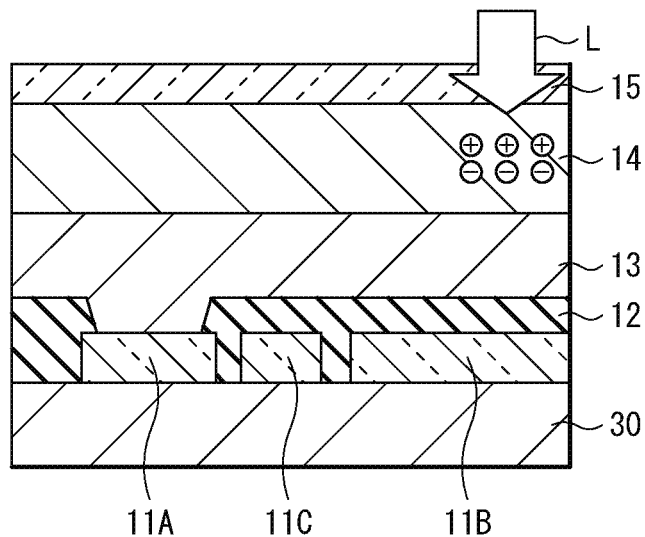
[FIG. 5B]
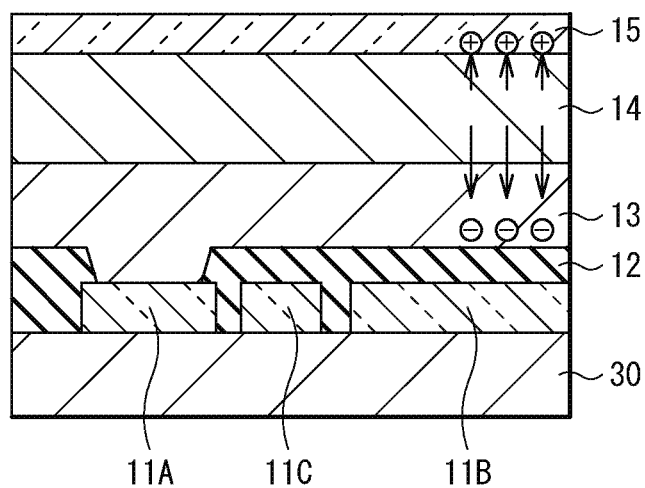
[FIG. 5C]
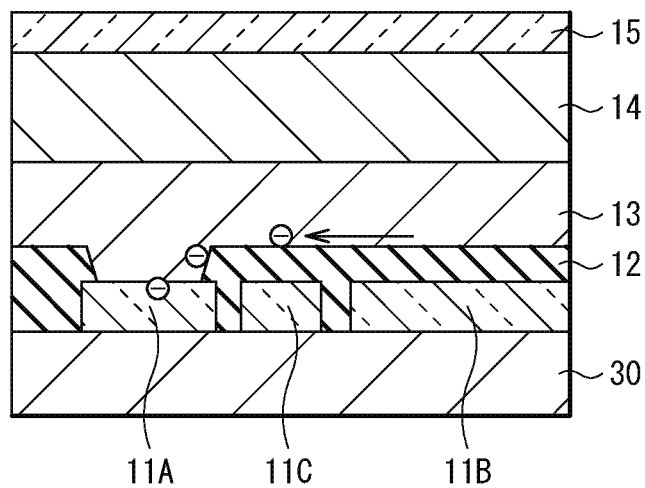

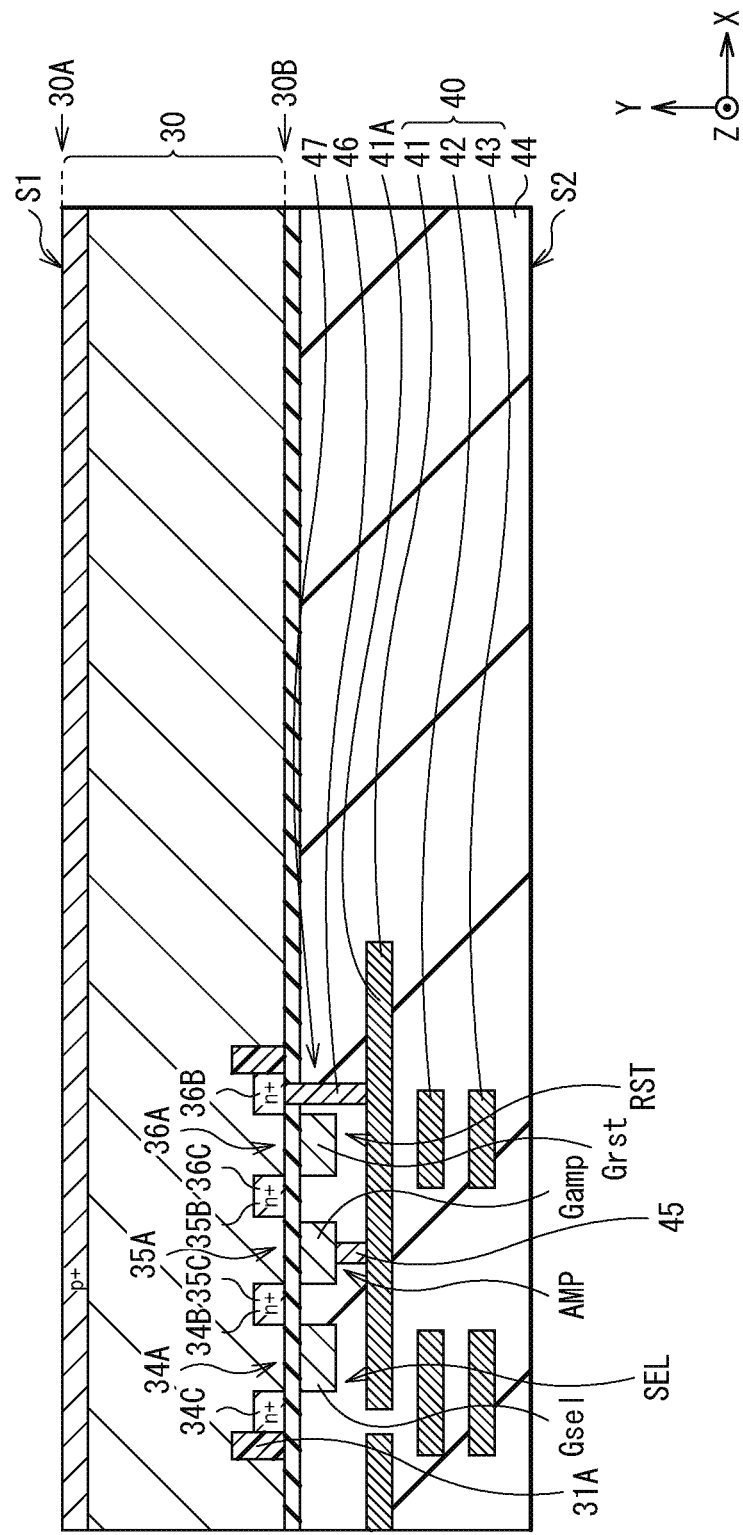
[FIG. 6A]

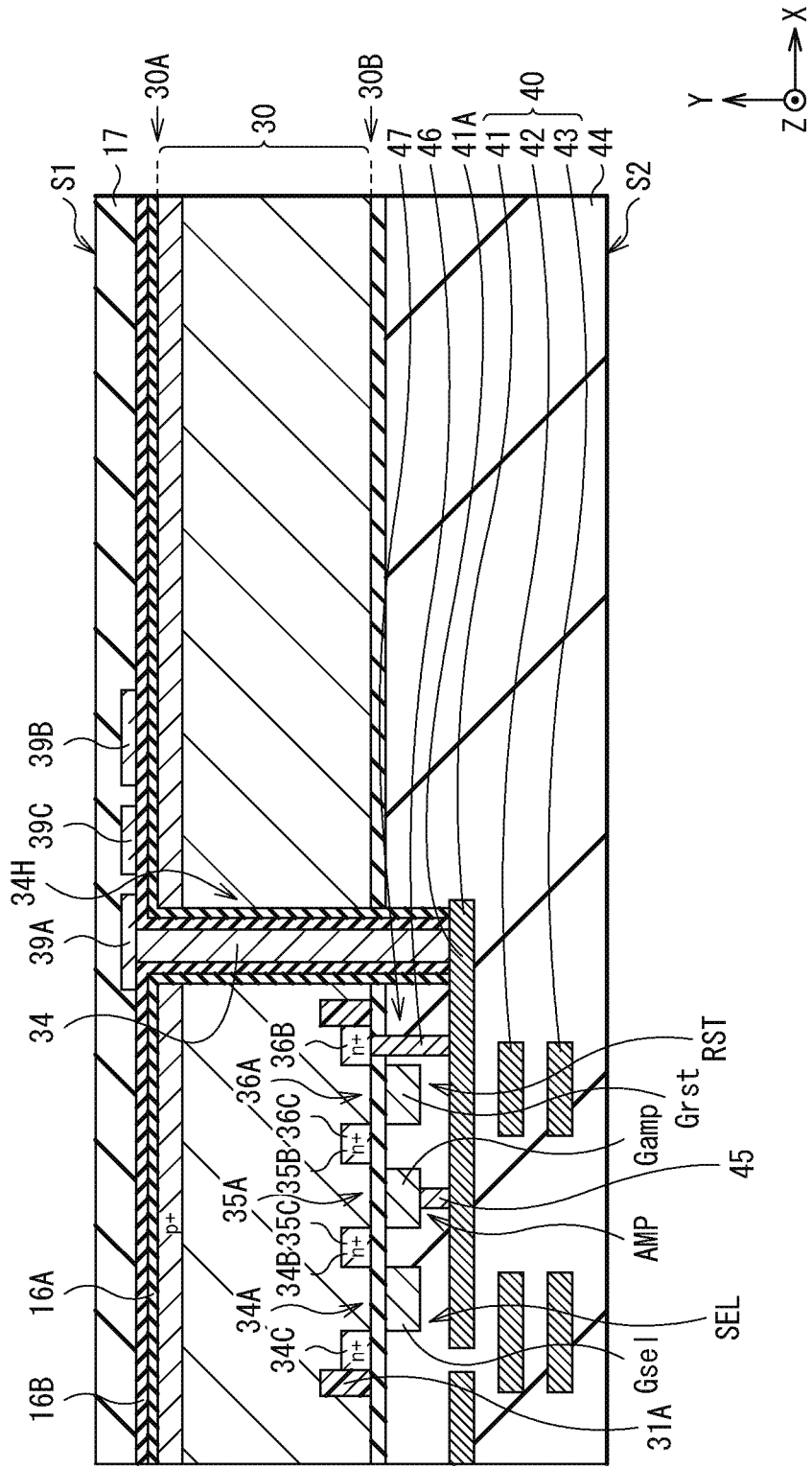
[FIG. 6B]

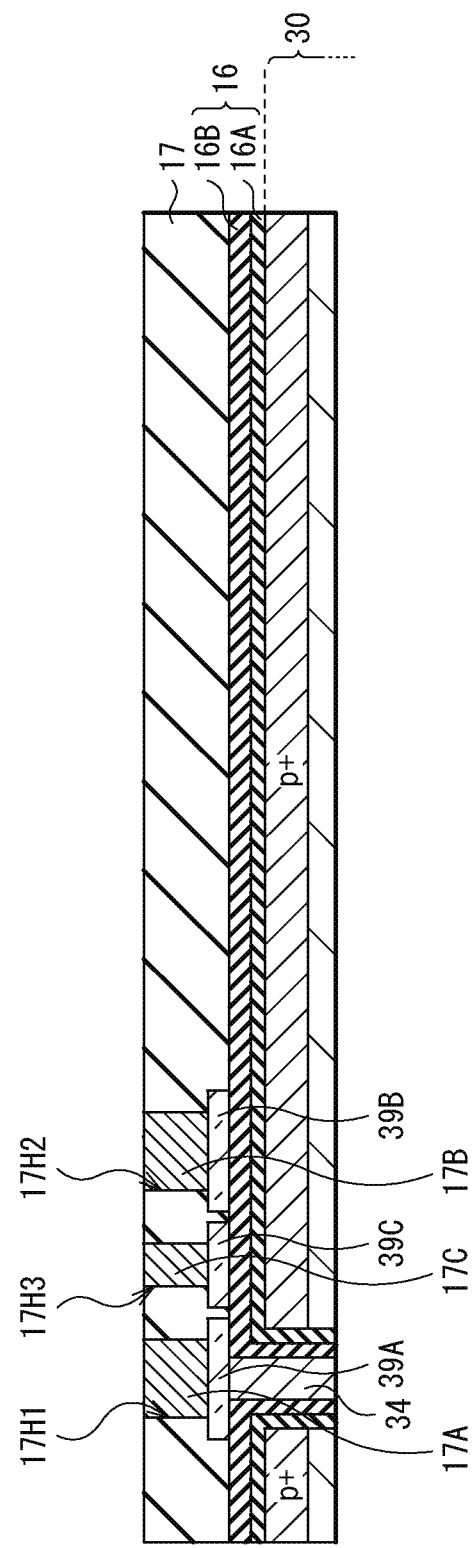
[FIG. 6C]

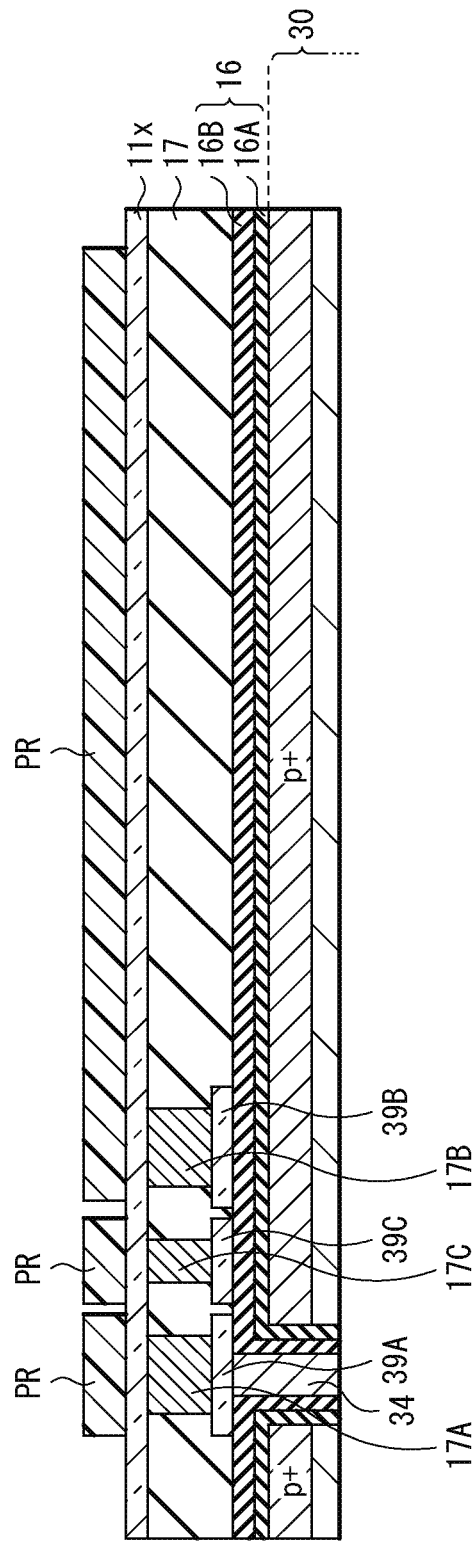
[FIG. 6D]

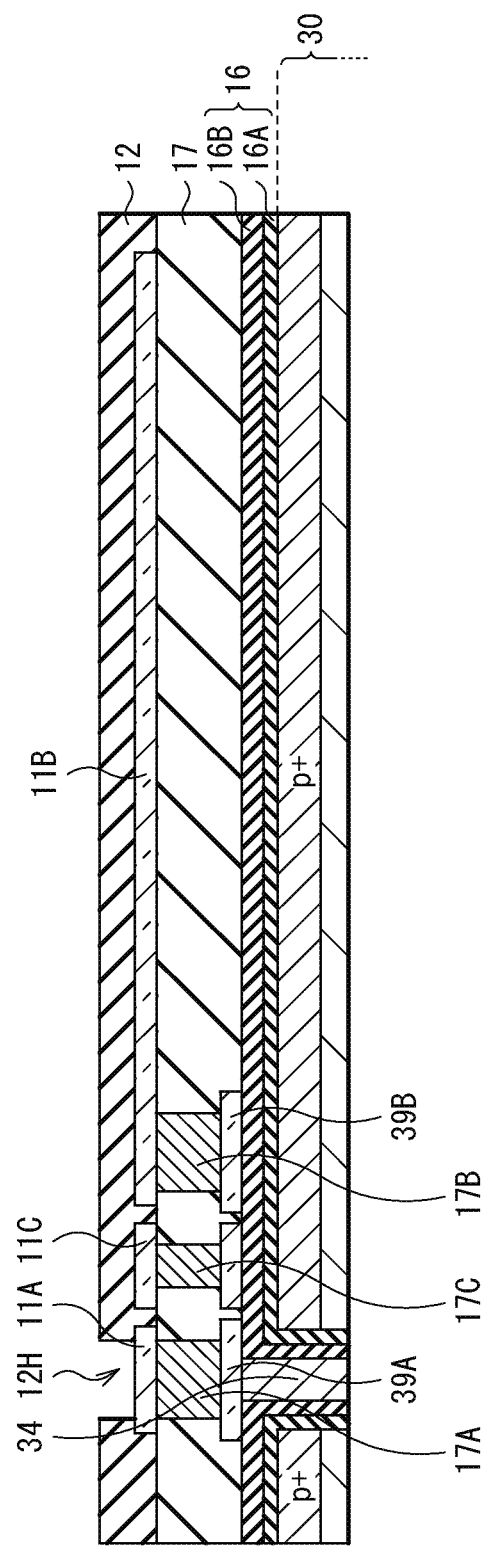
[FIG. 6E]

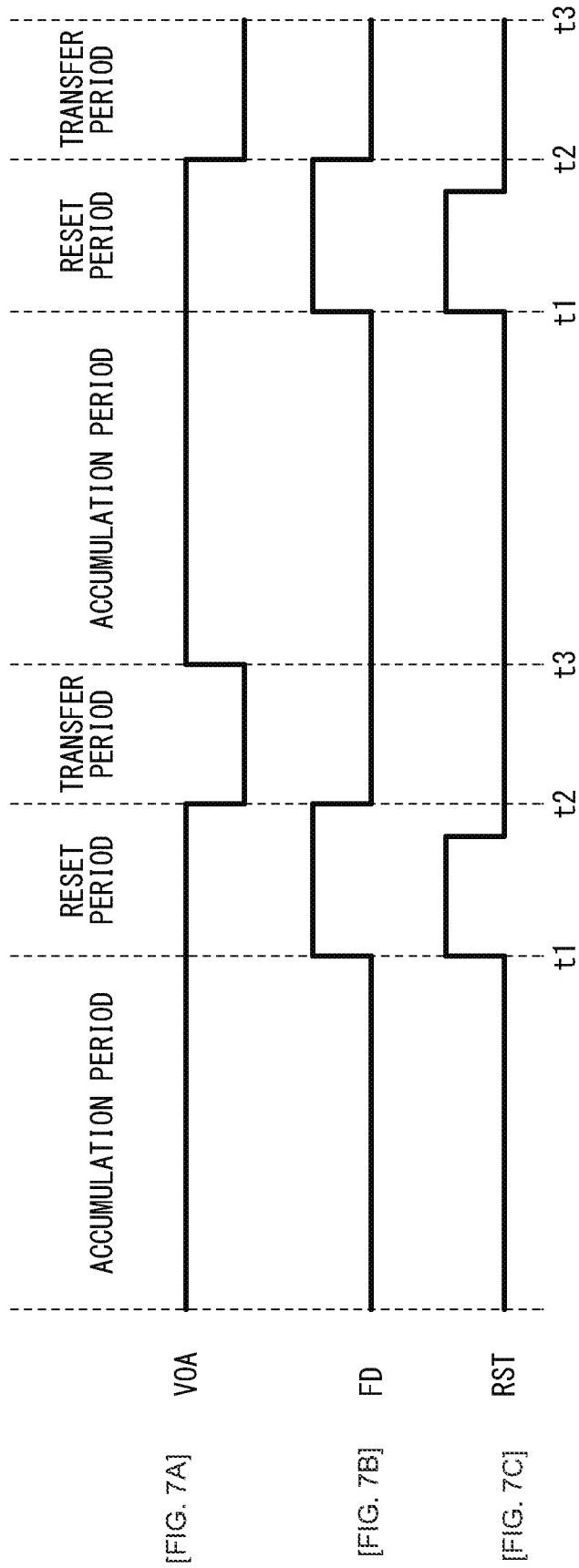

[FIG. 8]
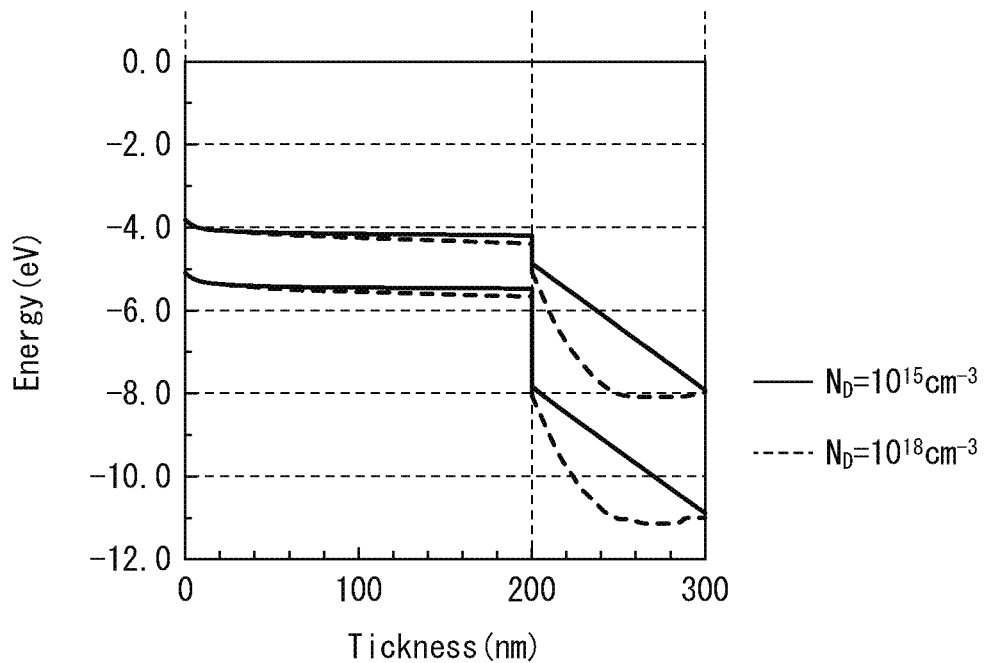
[FIG. 9]
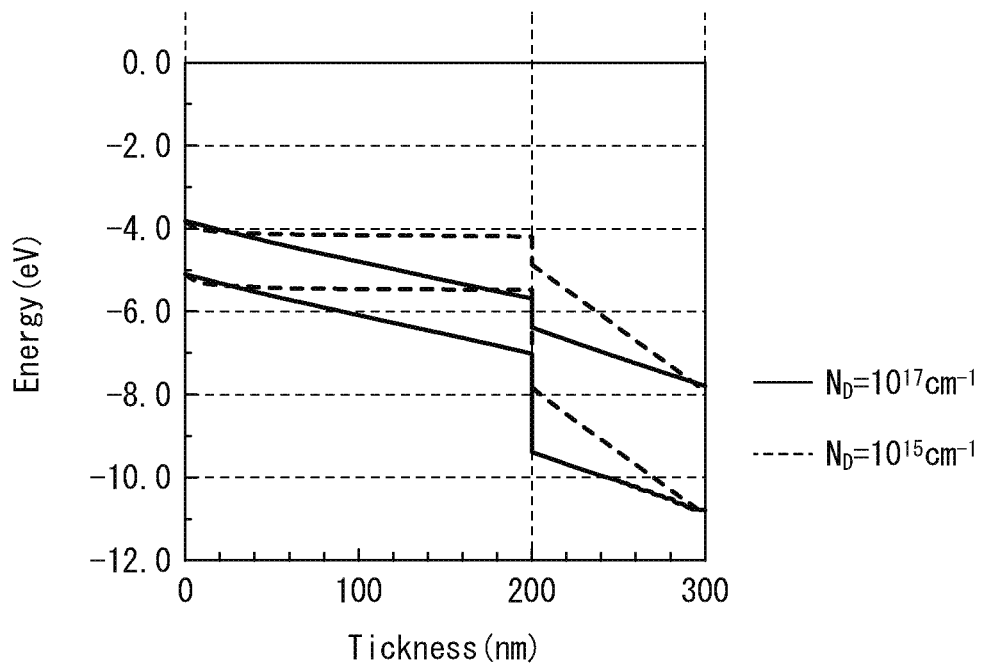

[FIG. 10]
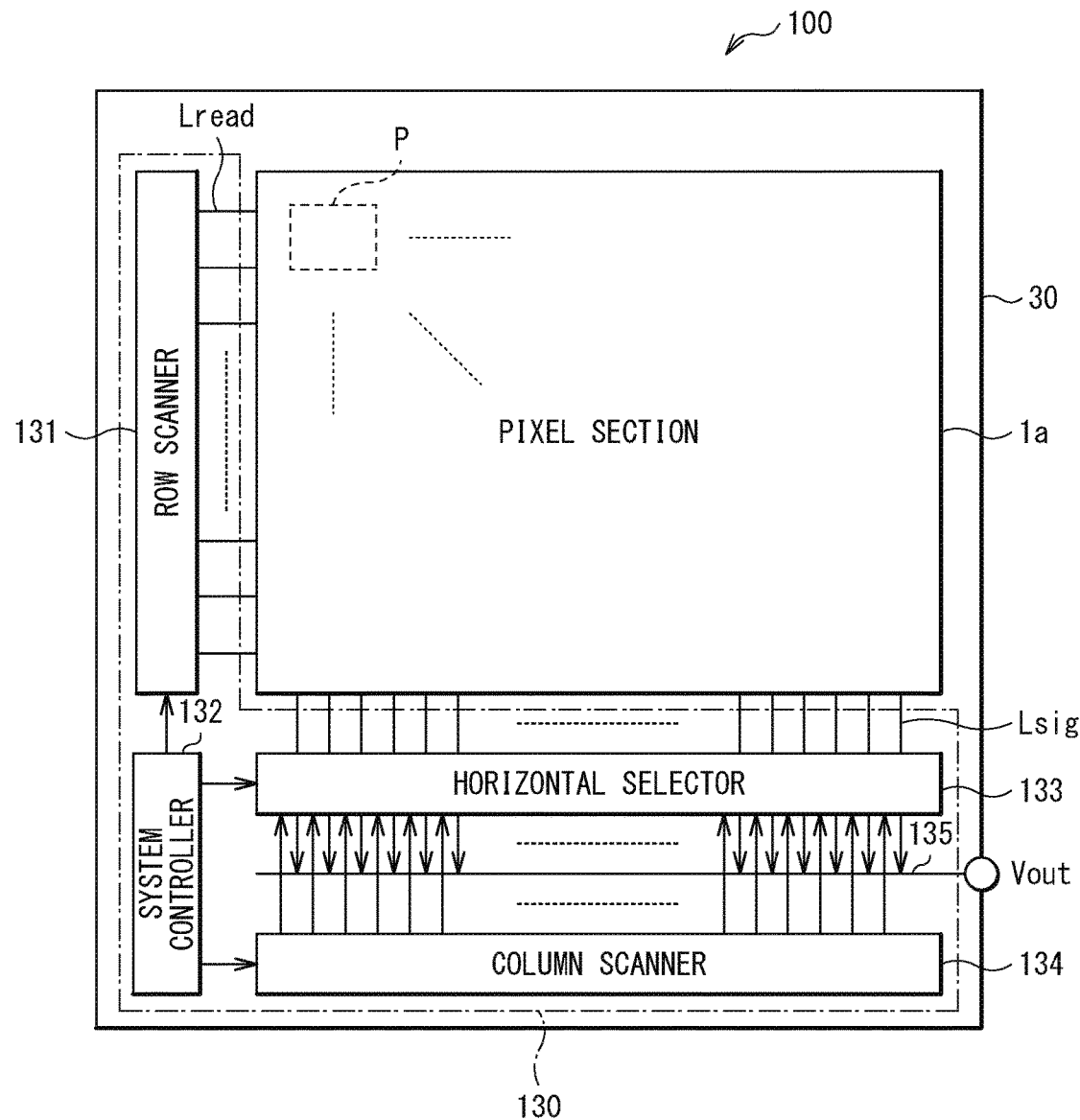

[FIG. 11]
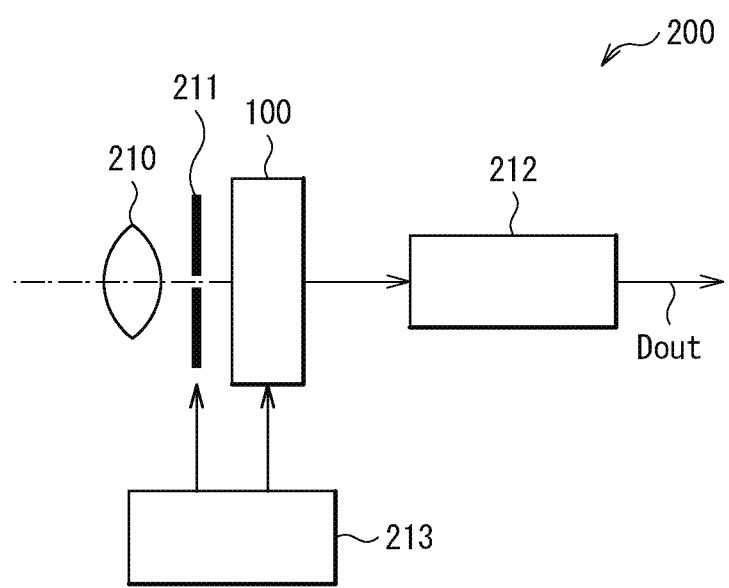

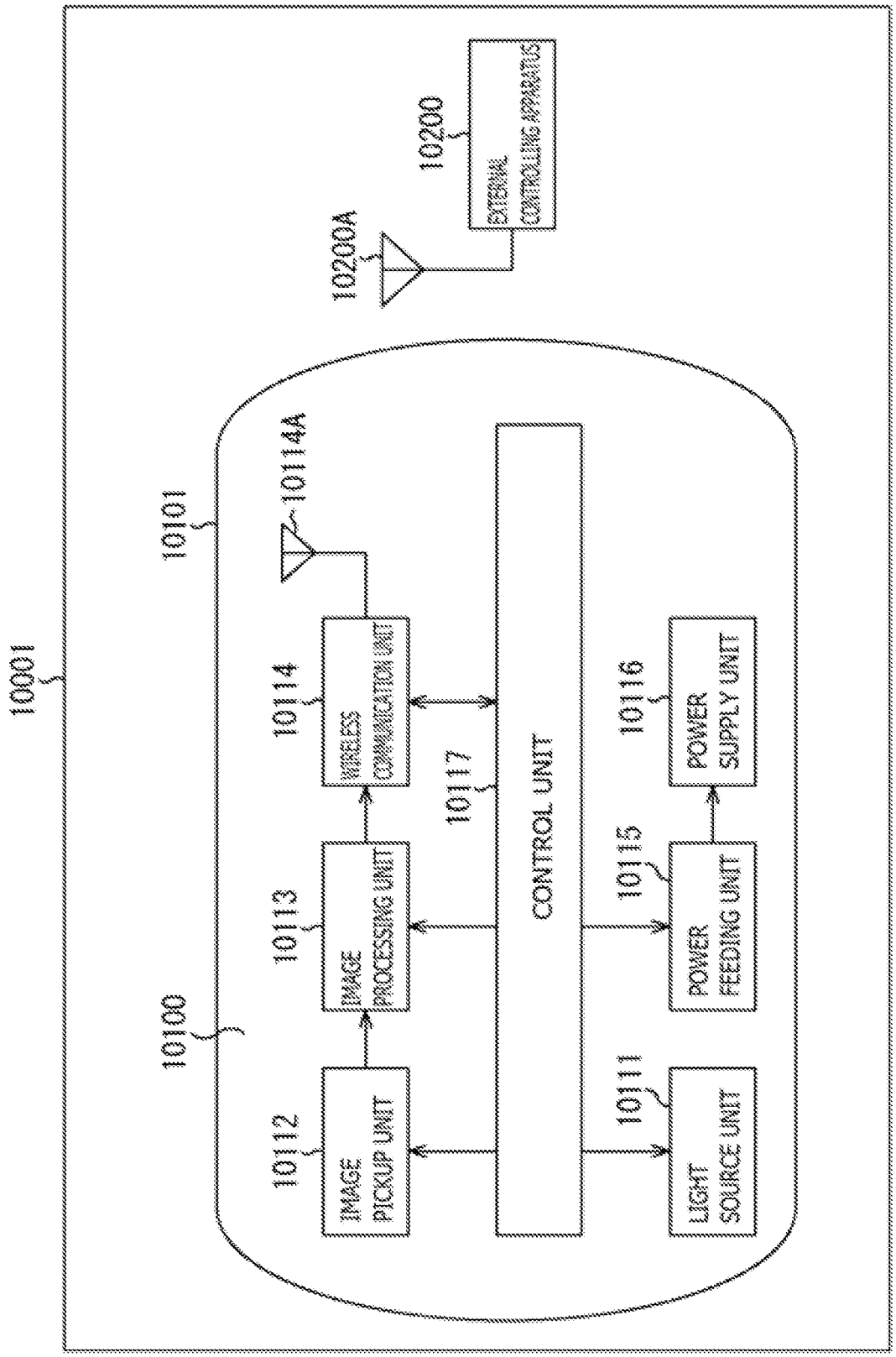
[FIG. 12]

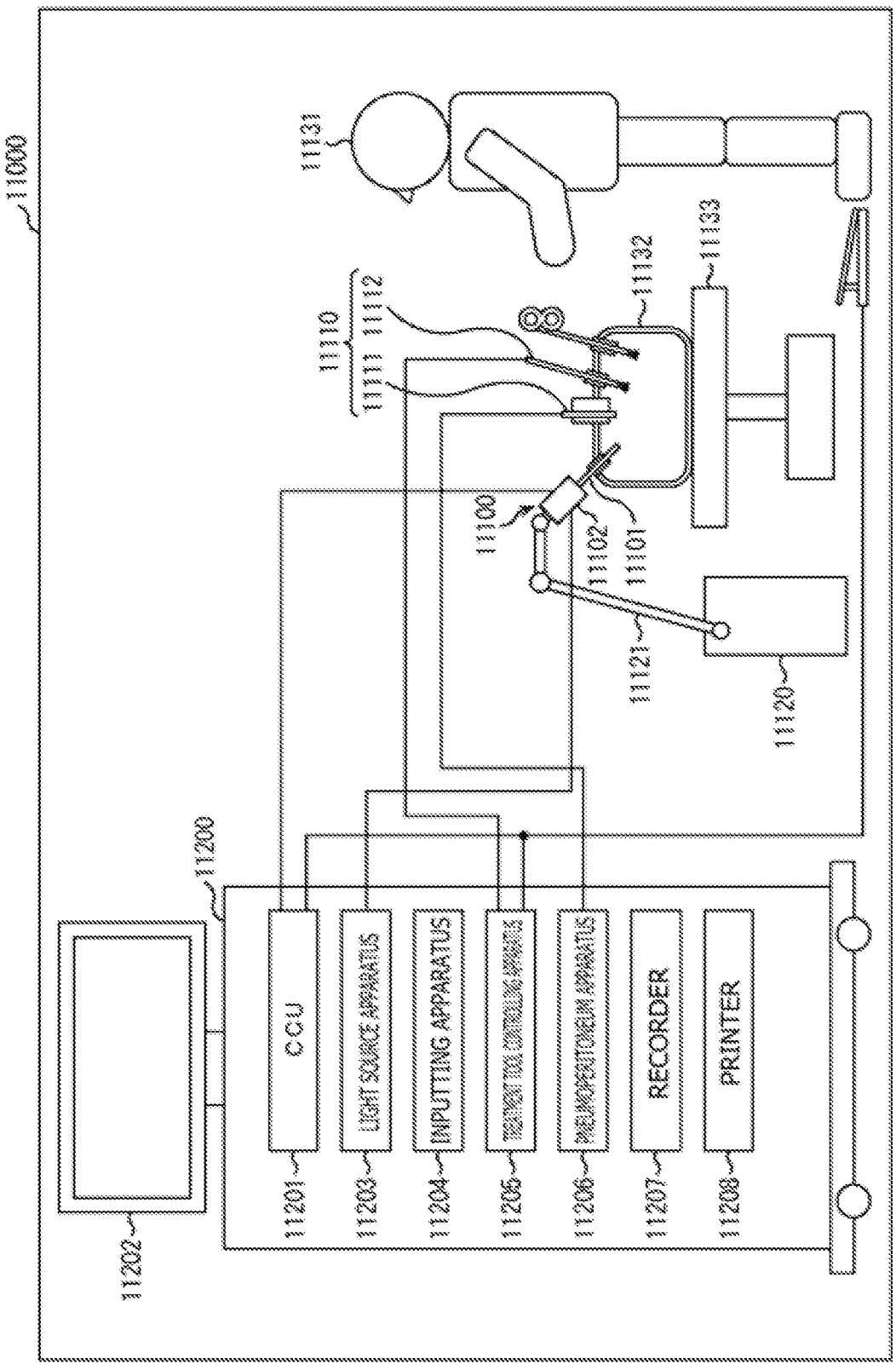
[FIG. 13]

[FIG. 14]
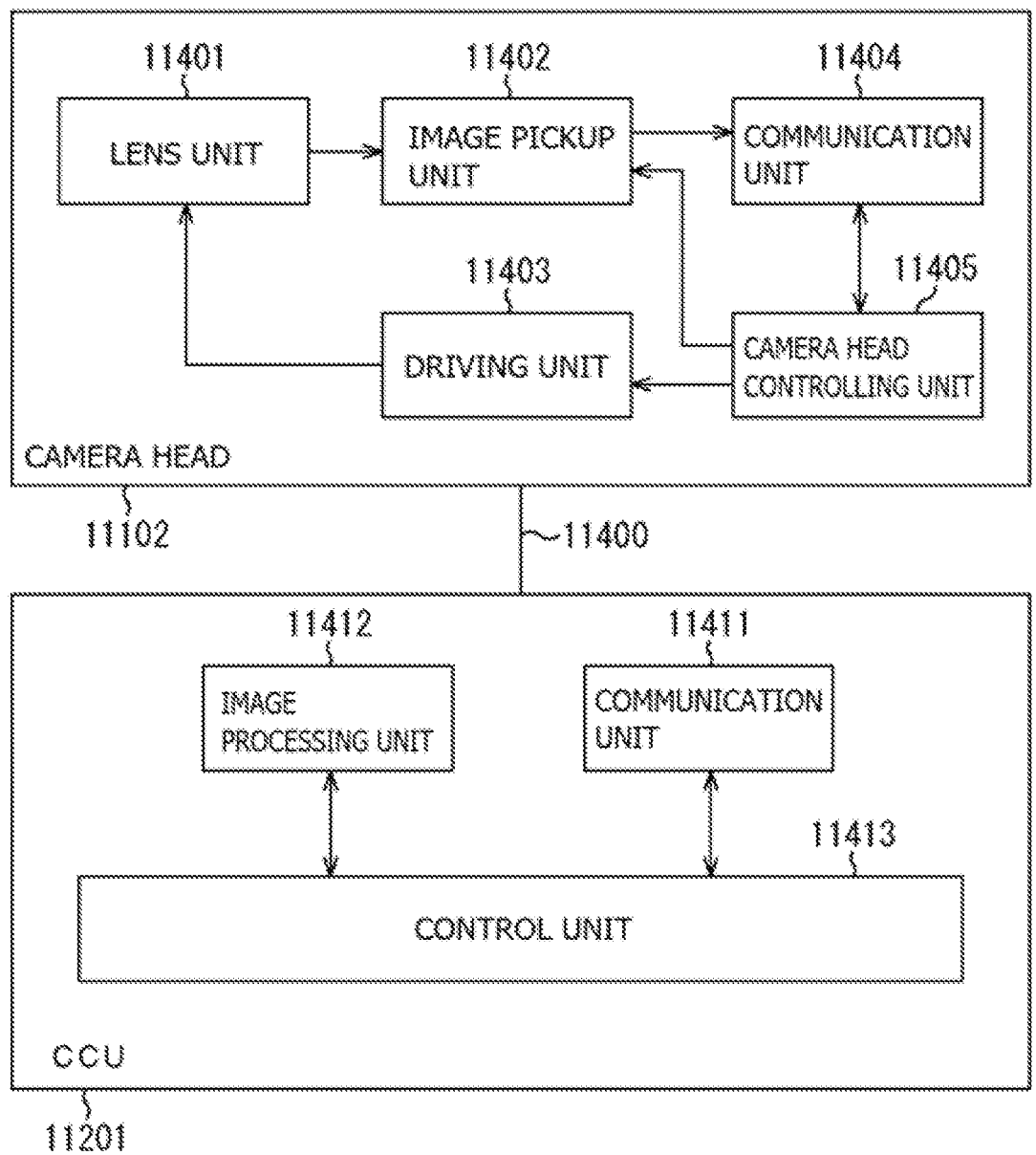

[FIG. 15]
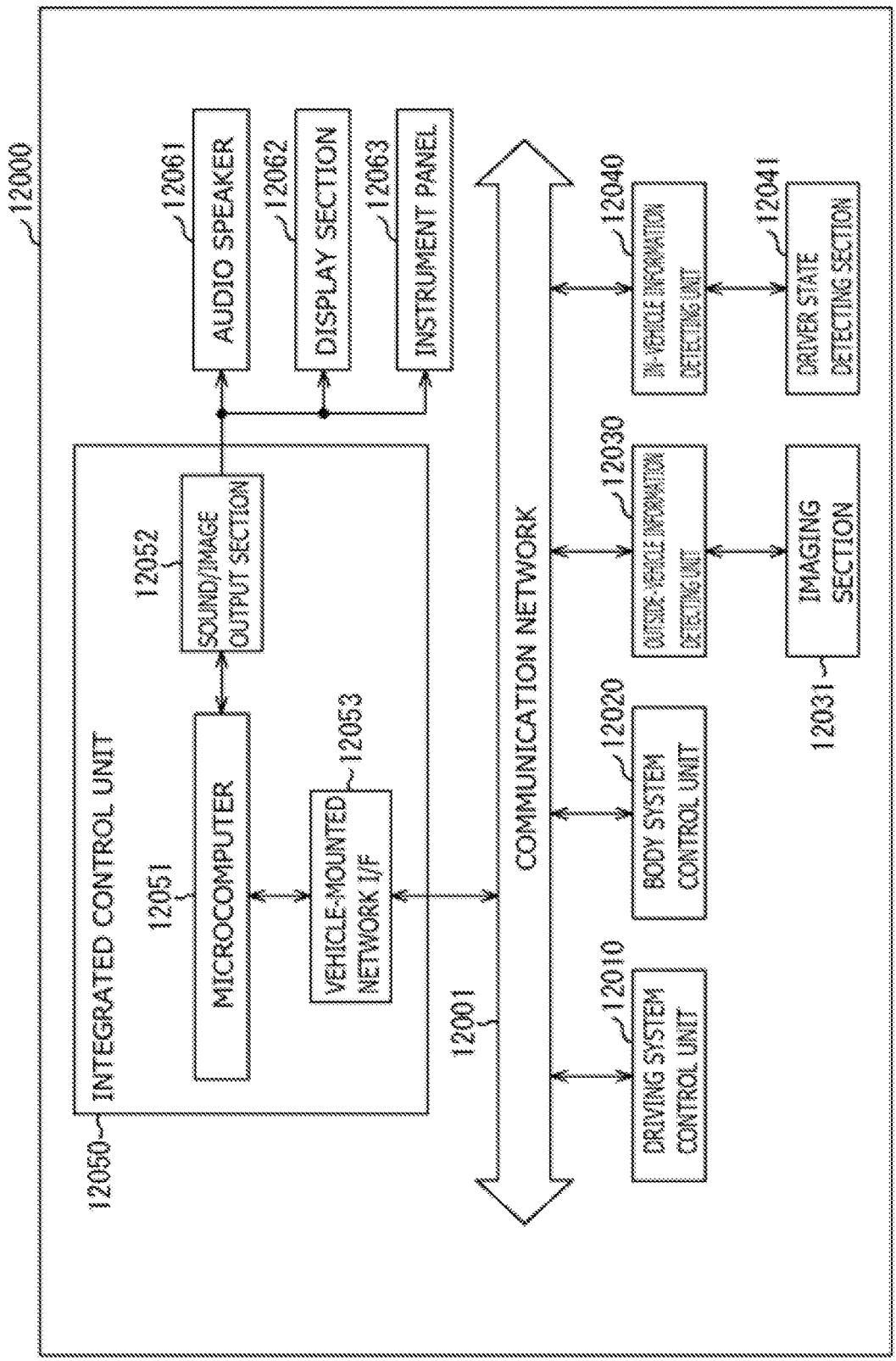

[FIG. 16]
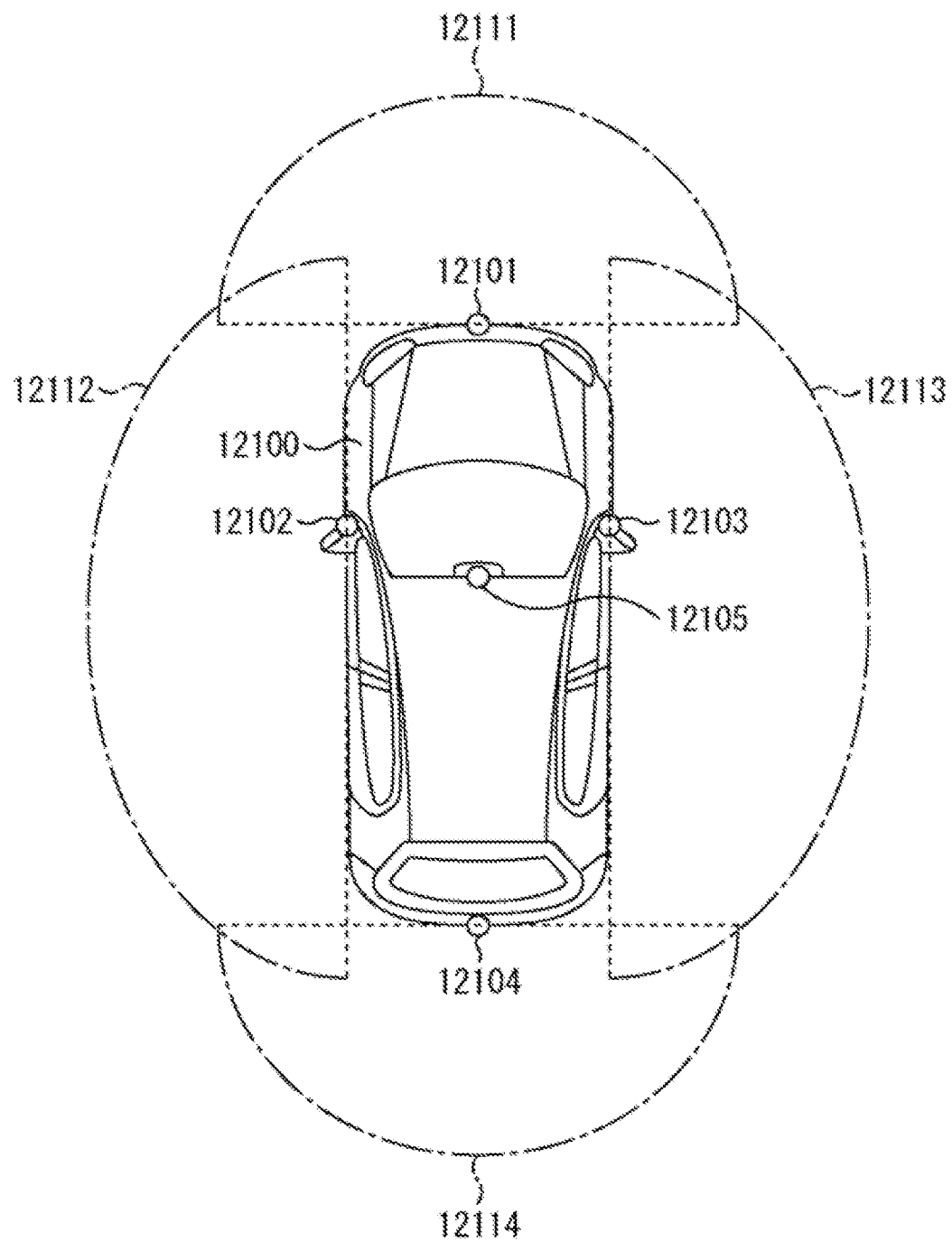

[FIG. 17]
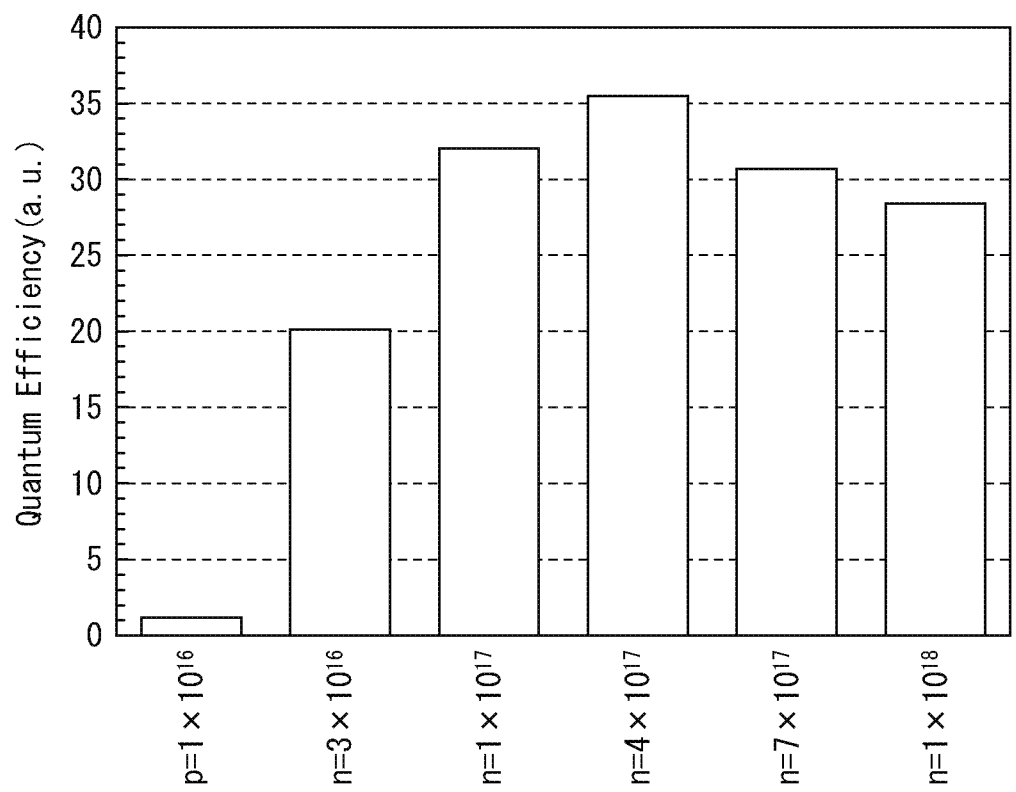

PHOTOELECTRIC CONVERSION ELEMENT AND IMAGING DEVICE

CROSS REFERENCE TO RELATED APPLICATIONS

This Patent Application is a Continuation Application of U.S. patent application Ser. No. 16/964,010 filed on Jul. 22, 2020, which is a U.S. National Phase of International Patent Application No. PCT/JP2019/001258 filed on Jan. 17, 2019, which claims priority benefit of Japanese Patent Application No. JP 2018-015406 filed in the Japan Patent Office on Jan. 31, 2018. Each of the above-referenced applications is hereby incorporated herein by reference in its entirety.

TECHNICAL FIELD

The present disclosure relates, for example, to a photoelectric conversion element having a photoelectric conversion layer including a semiconductor nanoparticle, and an imaging device including the photoelectric conversion element.

BACKGROUND ART

The pixel size of imaging devices such as CCD (Charge Coupled Device) image sensors or CMOS (Complementary Metal Oxide Semiconductor) image sensors has been decreasing. An imaging device including a photoelectric conversion section outside a semiconductor substrate generally accumulates charges generated by photoelectric conversion in a floating diffusion layer (floating diffusion; FD) formed inside the semiconductor substrate.

Incidentally, an imaging device provided with a photoelectric conversion section inside a semiconductor substrate temporarily accumulates charges generated by photoelectric conversion in the photoelectric conversion section inside the semiconductor substrate, and then transfers the charges to FD. This makes it possible to completely deplete a photoelectric conversion section. In contrast, the charges generated by a photoelectric conversion section provided outside a semiconductor substrate are directly accumulated in FD as described above, and it is thus difficult to completely deplete the photoelectric conversion section. This increases kTC noise and leads to more unfavorable random noise, bringing about imaging quality degradation.

To address this, for example, PTL 1 discloses an imaging element provided with an electrode for charge accumulation. The electrode for charge accumulation is disposed on a first electrode side of the first electrode and a second electrode to be spaced apart from the first electrode and opposed to a photoelectric conversion layer with an insulation layer interposed therebetween. The first electrode and the second electrode are disposed to be opposed to each other with the photoelectric conversion layer interposed therebetween. The first electrode is disposed on the opposite side to a light incidence side. This imaging element is able to accumulate charges generated by photoelectric conversion in the photoelectric conversion layer, and it is possible to completely deplete the charge accumulation section when exposure is started. Accordingly, it is possible to reduce imaging quality degradation.

CITATION LIST

Patent Literature

PTL 1: Japanese Unexamined Patent Application Publication No. 2017-157816

PTL 2: Japanese Unexamined Patent Application Publication No. 2010-177392

SUMMARY OF THE INVENTION

Incidentally, for example, PTL 2 discloses a photoelectric conversion element in which a semiconductor nanoparticle is used for a photoelectric conversion layer as a recently developed photoelectric conversion element having a sensitivity to near-infrared light. The photoelectric conversion element having a photoelectric conversion layer formed therein by using a semiconductor nanoparticle is required to increase quantum efficiency.

It is desirable to provide a photoelectric conversion element and an imaging device that make it possible to increase the quantum efficiency.

A photoelectric conversion element according to an embodiment of the present disclosure includes: a first electrode including a plurality of electrodes independent from each other; a second electrode disposed to be opposed to the first electrode; an n-type photoelectric conversion layer including a semiconductor nanoparticle, the n-type photoelectric conversion layer being provided between the first electrode and the second electrode; and a semiconductor layer including an oxide semiconductor material, the semiconductor layer being provided between the first electrode and the n-type photoelectric conversion layer.

An imaging device according to an embodiment of the present disclosure includes a plurality of pixels each provided with one or more photoelectric conversion elements, and includes the photoelectric conversion element according to the above-described embodiment as the photoelectric conversion element.

In the photoelectric conversion element and the imaging device according to the respective embodiments of the present disclosure, the n-type photoelectric conversion layer including the semiconductor nanoparticle is provided as a photoelectric conversion layer on the semiconductor layer provided between the first electrode and the second electrode disposed to be opposed to each other. This suppresses charge recombination, the charges having been generated by photoelectric conversion by applying a strong electric field to the n-type photoelectric conversion layer.

According to the electric conversion element and the imaging device of the respective embodiments of the present disclosure, the n-type photoelectric conversion layer including the semiconductor nanoparticle is provided as the photoelectric conversion layer, which makes it possible to apply a strong electric field to the n-type photoelectric conversion layer stacked on the semiconductor layer. Therefore, it becomes possible to suppress the charge recombination in the photoelectric conversion layer, and to increase the quantum efficiency.

It is to be noted that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is a schematic cross-sectional view of an imaging element according to an embodiment of the present disclosure.

FIG. 2 is a schematic cross-sectional view of a photoelectric conversion element illustrated in FIG. 1.

FIG. 3 is an equivalent circuit diagram of the imaging element illustrated in FIG. 1.

FIG. 4 is a schematic diagram illustrating disposition of a lower electrode and a transistor included in a control section of the imaging element illustrated in FIG. 1.

FIG. 5A is a diagram describing an operation principle of a photoelectric conversion element illustrated in FIG. 1.

FIG. 5B is a diagram describing an operation principle of a photoelectric conversion element illustrated in FIG. 1.

FIG. 5C is a diagram describing an operation principle of a photoelectric conversion element illustrated in FIG. 1.

FIG. 6A is a schematic cross-sectional view for describing a method of manufacturing the imaging element illustrated in FIG. 1.

FIG. 6B is a schematic cross-sectional view illustrating a step subsequent to FIG. 6A.

FIG. 6C is a schematic cross-sectional view illustrating a step subsequent to FIG. 6B.

FIG. 6D is a schematic cross-sectional view illustrating a step subsequent to FIG. 6C.

FIG. 6E is a schematic cross-sectional view illustrating a step subsequent to FIG. 6D.

FIGS. 7A, 7B, and 7C are timing charts illustrating an operation example of a photoelectric conversion element illustrated in FIG. 1.

FIG. 8 is a diagram of potential distribution between electrodes when a photoelectric conversion element serving as a comparative example is irradiated with light.

FIG. 9 is a diagram of potential distribution between electrodes when the photoelectric conversion element illustrated in FIG. 1 is irradiated with light.

FIG. 10 is a block diagram illustrating a configuration of an imaging device including the imaging element illustrated in FIG. 1 as a pixel.

FIG. 11 is a functional block diagram illustrating an example of an electronic apparatus (camera) including the imaging device illustrated in FIG. 10.

FIG. 12 is a block diagram depicting an example of a schematic configuration of an in-vivo information acquisition system.

FIG. 13 is a view depicting an example of a schematic configuration of an endoscopic surgery system.

FIG. 14 is a block diagram depicting an example of a functional configuration of a camera head and a camera control unit (CCU).

FIG. 15 is a block diagram depicting an example of schematic configuration of a vehicle control system.

FIG. 16 is a diagram of assistance in explaining an example of installation positions of an outside-vehicle information detecting section and an imaging section.

FIG. 17 is a characteristic diagram illustrating a relationship between a doping concentration and quantum efficiency of a photoelectric conversion layer according to a working example.

MODES FOR CARRYING OUT THE INVENTION

In the following, some embodiments of the present disclosure are described in detail with reference to the drawings. It is to be noted that description is given in the following order.

1. Embodiment (example of photoelectric conversion element provided with n-type photoelectric conversion layer)
   1-1. Configuration of Imaging Element
   1-2. Method of Manufacturing Imaging Element
   1-3. Method of Controlling Imaging Element
   1-4. Workings and Effects
2. Application Examples
3. Working Examples FIG. 1 schematically illustrates the cross-sectional configuration of an imaging element (imaging element 1) according to an embodiment of the present disclosure. FIG. 2 is a schematic enlarged view of the cross-sectional configuration of a main part (photoelectric conversion element 10) of the imaging element 1 illustrated in FIG. 1. FIG. 3 is an equivalent circuit diagram of the imaging element 1 illustrated in FIG. 1. FIG. 4 schematically illustrates the disposition of a lower electrode 11 and a transistor included in a control section of the imaging element 1 illustrated in FIG. 1. This imaging element 1 is included in one pixel (unit pixel P), for example, in an imaging device (imaging device 100; see FIG. 10) such as a CMOS image sensor.

(1-1. Configuration of Imaging Element)

The imaging element 1 is provided, for example, with the photoelectric conversion element 10 on a first surface (back surface) 30A side of a semiconductor substrate 30. The photoelectric conversion element 10 according to the present embodiment includes an n-type doped photoelectric conversion layer (n-type photoelectric conversion layer 14) including a semiconductor nanoparticle between the lower electrode 11 (first electrode) and an upper electrode 15 (second electrode) disposed to be opposed to each other. A semiconductor layer 13 is provided between the lower electrode 11 and the n-type photoelectric conversion layer 14 with an insulation layer 12 interposed therebetween. The lower electrode 11 includes a readout electrode 11A, an accumulation electrode 11B, and a transfer electrode 11C as a plurality of electrodes independent from each other. The transfer electrode 11C is disposed, for example, between the readout electrode 11A and the accumulation electrode 11B. The accumulation electrode 11B and the transfer electrode 11C is covered with the insulation layer 12. The readout electrode 11A is electrically coupled to the semiconductor layer 13 via an opening 12H provided to the insulation layer 12.

It is to be noted that, in the present embodiment, a case is described where the electron of a pair of an electron and a hole (electron-hole pair) generated by photoelectric conversion is read out as a signal charge. In addition, in the drawings, "+(plus)" attached to "p" or "n" indicates that the concentration of p-type or n-type impurities is high, and "++" indicates that the concentration of p-type or n-type impurities is further higher than "+".

The photoelectric conversion element 10 is a photoelectric conversion element that absorbs the light corresponding to a portion or the whole of a selective wavelength range (e.g., 700 nm or more and 2500 nm or less) to generate an electron-hole pair. The photoelectric conversion element 10 has a configuration in which the lower electrode 11, the insulation layer 12, the semiconductor layer 13, the n-type photoelectric conversion layer 14, and the upper electrode 15 are stacked in this order, for example, on the first surface 30A side of the semiconductor substrate 30 as illustrated in FIG. 2. It is to be noted that FIG. 2 omits a fixed charge layer 16A, a dielectric layer 16B, an inter-layer insulation layer 17, and the like. The lower electrode 11 is, for example, separately formed for each unit pixel P. The lower electrode 11 also includes the readout electrode 11A, the accumulation electrode 11B, and the transfer electrode 11C that are separated from each other by the insulation layer 12 as described in detail below. FIG. 1 illustrates an example in which the semiconductor layer 13, the n-type photoelectric conversion layer 14, and the upper electrode 15 are separately formed for each imaging element 1. However, the semiconductor layer 13, the n-type photoelectric conversion layer 14, and the upper electrode 15 may be provided, for example, as a continuous layer common to the plurality of imaging elements 1.

As described above, the lower electrode 11 includes, for example, the readout electrode 11A, the accumulation electrode 11B, and the transfer electrode 11C that are independent from each other. For example, it is possible to form the lower electrode 11 by using an electrically-conductive material (transparent electrically-conductive material) having light transmissivity. For example, the transparent electrically-conductive material preferably has a band gap energy of 2.5 eV or higher, and desirably has a band gap energy of 3.1 eV or higher. The transparent electrically-conductive material includes a metallic oxide. Specific examples thereof include indium oxide, an indium tin oxide (ITO: Indium Tin Oxide including Sn-doped $In_2O_3$, crystalline ITO, and amorphous ITO), an indium zinc oxide (IZO: Indium Zinc Oxide) obtained by adding indium as a dopant to zinc oxide, an indium gallium oxide (IGO) obtained by adding indium as a dopant to gallium oxide, an indium gallium zinc oxide (IGZO: $In-GaZnO_4$) obtained by adding indium and gallium as dopants to zinc oxide, an indium tin zinc oxide (ITZO) obtained by adding indium and Tin as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with another element), an aluminum zinc oxide (AZO) obtained by adding aluminum as a dopant to zinc oxide, a gallium zinc oxide (GZO) obtained by adding gallium as a dopant to zinc oxide, titanium oxide ($TiO_2$), a niobium titanium oxide (TNO) obtained by adding niobium as a dopant to titanium oxide, antimony oxide, a spinel oxide, and an oxide having a $YbFe_2O_4$ structure. Additionally, a transparent electrode including a gallium oxide, a titanium oxide, a niobium oxide, a nickel oxide, or the like as a base layer may be exemplified. The film thickness (that is referred to simply as thickness below) of the lower electrode 11 in the Y-axis direction is, for example, $2 \times 10^{-8}$ m or more and $2 \times 10^{-7}$ m or less, and preferably $3 \times 10^{-8}$ m or more and $1 \times 10^{-7}$ m or less.

It is to be noted that, in a case where the transparency is not required in the lower electrode 11, for example, it is possible to form the lower electrode 11 as a single-layer film or a stacked film using a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), or an alloy thereof. Specifically, the lower electrode 11 may be formed using Al—Nd (an alloy of aluminum and neodymium), ASC (an alloy of aluminum, samarium, and copper), or the like. Further, it is possible to form the lower electrode 11 by using an electrically-conductive material such as a conductive particle including the above-mentioned metal or the alloy thereof, polysilicon containing impurities, a carbon-based material, an oxide semiconductor material, a carbon nanotube, or graphene. In addition, the lower electrode 11 may be formed by using an organic material (conductive polymer) such as poly(3,4-ethylenedioxythiophene)/polystyrenesulfonic acid [PEDOT/PSS], and may be formed by mixing these electrically-conductive materials into a binder (polymer) to form a paste or an ink, and curing the paste or the ink.

The readout electrode 11A transfers the signal charges generated in the n-type photoelectric conversion layer 14 to a floating diffusion FD1. The readout electrode 11A is coupled to the floating diffusion FD1 provided on a second surface (front surface) 30B side of a semiconductor substrate 20, for example, via an upper first contact 17A, a pad section 39A, a through electrode 34, a coupling section 41A, and a lower second contact 46.

The accumulation electrode 11B accumulates, in the semiconductor layer 13, the signal charges (electrons) of the charges generated in the n-type photoelectric conversion layer 14. It is desirable that the accumulation electrode 11B be larger than the readout electrode 11A, allowing the accumulation electrode 11B to accumulate many charges.

The transfer electrode 11C increases the efficiency of transferring the charges accumulated on the accumulation electrode 11B to the readout electrode 11A, and is provided between the readout electrode 11A and the accumulation electrode 11B. This transfer electrode 11C is coupled to a pixel drive circuit, for example, via an upper third contact 17C and a pad section 39C. The pixel drive circuit is included in a drive circuit. It is possible to independently apply respective voltages to the readout electrode 11A, the accumulation electrode 11B, and the transfer electrode 11C.

The insulation layer 12 electrically separates the semiconductor layer 13 from the accumulation electrode 11B and the transfer electrode 11C. The insulation layer 12 is provided, for example, on the inter-layer insulation layer 17 to cover the lower electrode 11. In addition, the insulation layer 12 is provided with the opening 12H on the readout electrode 11A of the lower electrode 11. The readout electrode 11A and the semiconductor layer 13 are electrically coupled via this opening 12H. It is preferable to incline the side surface of the opening 12H to spread the side surface of the opening 12H toward the light incidence side S1, for example, as illustrated in FIG. 2. This facilitates charges to move from the semiconductor layer 13 to the readout electrode 11A.

Materials of the insulation layer 12 include inorganic insulation materials such as metallic oxide high-dielectric constant insulation materials including a silicon oxide-based material, silicon nitride ($SiN_x$), aluminum oxide ($Al_2O_3$), and the like. Examples of materials of the insulation layer 12 may additionally include polymethyl methacrylate (PMMA), polyvinyl phenol (PVP), polyvinyl alcohol (PVA), polyimide, polycarbonate (PC), polyethylene terephthalate (PET), polystyrene, a silanol derivative (silane coupling agent) such as N-2 (aminoethyl) 3-aminopropyltrimethoxysilane (AEAPTMS), 3-mercaptopropyl trimethoxysilane (MPTMS), or octadecyltrichlorosilane (OTS), novolak type phenolic resin, a fluorine-based resin, and organic insulation materials (organic polymers) exemplified as a straight-chain hydrocarbon having, in one end thereof, a functional group that is able to be bound to a control electrode such as octadecanethiol or dodecyl isocyanate, and a combination thereof may be used. It is to be noted that examples of a silicon oxide-based material include silicon oxide ($SiO_x$), BPSG, PSG, BSG, AsSG, PbSG, silicon oxynitride (SiON), SOG (spin-on-glass), and a low-dielectric constant material (e.g., polyaryl ether, cyclo perfluorocarbon polymer and benzocyclobutene, cyclic fluorine resin, polytetrafluoroethylene, aryl ether fluoride, polyimide fluoride, amorphous carbon, and organic SOG).

The semiconductor layer 13 accumulates the signal charges generated in the n-type photoelectric conversion layer 14, and transfers the signal charges to the readout electrode 11A. The semiconductor layer 13 preferably has a carrier density of $10^{14}$ cm$^{-3}$ or more and $10^{17}$ cm$^{-3}$ or less, for example. The semiconductor layer 13 is preferably formed by using a material having a higher charge mobility than that of the n-type photoelectric conversion layer 14 and having a large band gap. This makes it possible, for example, to transfer charges at higher speed and suppress hole injection from the readout electrode to the semiconductor layer.

The semiconductor layer 13 includes, for example, an oxide semiconductor material. Examples of the oxide semiconductor material include IGZO (In—Ga—Zn—O-based oxide semiconductor), ZTO (Zn—Sn—O-based oxide semiconductor; $Zn_2SnO_4$), IGZTO (In—Ga—Zn—Sn—O-based oxide semiconductor; InGaZnSnO), GTO (Ga—Sn—O-based oxide semiconductor; Ga$_2$O$_3$:SnO$_2$), and IGO (In—Ga—O-based oxide semiconductor). It is preferable to use at least one of the above-described oxide semiconductor materials for the semiconductor layer 13, and especially IGZO is favorable use. The semiconductor layer 13 has a thickness of 30 nm or more and 200 nm or less, for example, and preferably has a thickness of 60 nm or more and 150 nm or less.

The n-type photoelectric conversion layer 14 converts light energy to electric energy. For example, the n-type photoelectric conversion layer 14 provides a field to separate, into an electron and a hole, an exciton generated when absorbing the light within a wavelength range of 700 nm or more and 2500 nm or less. The n-type photoelectric conversion layer 14 includes a semiconductor nanoparticle, and has a configuration in which a plurality of semiconductor nanoparticles is dispersed in an electrically-conductive polymer, for example. A semiconductor nanoparticle is a particle generally having a particle diameter of several nm to several tens nm, and includes, for example, a core, a shell provided around the core, and a ligand bound to the surface of the shell. It is to be noted that the shell layer is not an essential element, and the semiconductor nanoparticle may include a core and a ligand bound to the surface of the core. The n-type photoelectric conversion layer 14 according to the present embodiment is n-type doped as described above. The n-type photoelectric conversion layer 14 preferably has a carrier density of $n=3\times10^{16}$ cm$^{-3}$ or more and $1\times10^{18}$ cm$^{-3}$ or less, for example, and more preferably has a carrier density of $1\times10^{17}$ cm$^{-3}$ or more and $7\times10^{17}$ cm$^{-3}$ or less.

The semiconductor nanoparticle included in the n-type photoelectric conversion layer 14 includes the following materials, for example. Examples of materials included in the core include: silicon, which is a group IV semiconductor, and selenium; and compound semiconductors such as chalcopyrite-based compounds including CuInGaSe, CuInSe$_2$, CuInS$_2$, CuAlS$_2$, CuAlSe$_2$, CuGaS$_2$, CuGaSe$_2$, CuZnSnSSe, ZnCuInSe, AgAlS$_2$, AgAlSe$_2$, AgInS$_2$, and AgInSe$_2$, III-V group compounds including GaAs, InAs, InP, AlGaAs, InGaP, and AlGaInP, II-VI group compounds including CdS, CdSe, CdTe, ZnO, ZnS, ZnSe, ZnTe, and HgTe, and IV-VI group compounds including PbO, PbS, PbSe, and PbTe. Examples of materials included in the shell include PbO, PbO$_2$, Pb$_3$O$_4$, ZnS, ZnSe, and ZnTe.

The semiconductor nanoparticle increases in band gap due to quantum-confinement effects when the particle diameter is less than twice an exciton Bohr radius of the material. An average particle diameter of the semiconductor nanoparticle included in the n-type photoelectric conversion layer 14 of the present embodiment is preferably 3 nm or more and 6 nm or less, for example. Here, it is assumed that the particle diameter of the semiconductor nanoparticle is the particle diameter of a core or the particle diameter of a core including a shell in a case where the core is covered with the shell. It is possible to adjust the size of a core and the size of a core including a shell in accordance with the amount of raw materials to be supplied and a reaction condition for the synthesis thereof. The ligand includes, for example, an absorption group that interacts with the surface of a core or a shell, and an alkyl chain that is bound thereto. The alkyl chain includes, for example, 2 to 50 carbon atoms, and examples of the absorption group include an amine group, a phosphone group, a phosphine group, a carboxyl group, a hydroxyl group, and a thiol group. Additionally, halogen atoms may be used such as chlorine (Cl), bromine (Br), and iodine (I).

It is possible to change the polarity of the n-type photoelectric conversion layer 14 including the semiconductor nanoparticle, for example, by selecting an appropriate material as a ligand included in the semiconductor nanoparticle. Further, it is possible to change the polarity of the n-type photoelectric conversion layer 14 including the semiconductor nanoparticle by changing an element ratio of a core included in the semiconductor nanoparticle. In the present embodiment, it is preferable that the semiconductor nanoparticle included in the n-type photoelectric conversion layer 14 include PbS as a core, PbO as a shell, and halogen atoms such as chlorine (Cl), bromine (Br), and iodine (I) as a ligand, for example. In addition, in the n-type photoelectric conversion layer 14, it is preferable that the element ratio of the semiconductor nanoparticle included in the semiconductor nanoparticle be adjusted so as to be rich in Pb. This makes it possible to make the polarity of the n-type photoelectric conversion layer 14 to be n-type.

The n-type photoelectric conversion layer 14 has a thickness of 100 nm or more and 1000 nm or less, for example, and preferably has a thickness of 300 nm or more and 800 nm or less.

The upper electrode 16 includes an electrically-conductive material having light transmissivity. The upper electrode 16 may be separated for each unit pixel P or formed as an electrode common to the respective unit pixels P. The upper electrode 16 has a thickness of 10 nm to 200 nm, for example.

It is to be noted that other layers may be provided between the n-type photoelectric conversion layer 14 and the upper electrode 15. For example, in a case where an electron is read out as a signal charge as in the present embodiment, a layer including a material such as MoO$_3$, WO$_3$, or V$_2$O$_5$ having a large work function may be added between the n-type photoelectric conversion layer 14 and the upper electrode 15. This makes it possible to strengthen the internal electric field generated between the lower electrode 11 and the upper electrode 15.

In the photoelectric conversion element 10 according to the present embodiment, near-infrared light L inputted to the photoelectric conversion element 10 from the upper electrode 15 side is absorbed by the n-type photoelectric conversion layer 14. An exciton generated by this is separated, for example, as illustrated in FIG. 5A, and dissociated into an electron and a hole. The respective charges (electrons and holes) generated here are transported to different electrodes, for example, as illustrated in FIG. 5B by diffusion due to a difference in carrier concentration or by an internal electric field due to a difference in work functions between an anode (upper electrode 15 here) and a cathode (lower electrode 11 here). The directions in which an electron and a hole are transported are controlled by applying a potential between the lower electrode 11 and the upper electrode 15. Here, electrons are carried onto the lower electrode 11 side as signal charges. The electrons carried onto the lower electrode 11 side are accumulated in the semiconductor layer 13 above the accumulation electrode 11B, and then transferred toward the readout electrode 11A as illustrated in FIG. 5C. The transferred electrons are detected as a photocurrent.

The second surface 30B of the semiconductor substrate 30 is provided, for example, with the floating diffusion (floating diffusion layer) FD1 (region 36B in the semiconductor substrate 30), an amplifier transistor (modulation element) AMP, a reset transistor RST, a selection transistor SEL, and a multilayer wiring line 40. The multilayer wiring line 40 has a configuration in which wiring layers 41, 42, and 43, for example, are stacked in an insulation layer 44.

It is to be noted that the diagram illustrates the first surface 30A side of the semiconductor substrate 30 as a light incidence side S1, and the second surface 30B side thereof as a wiring layer side S2.

For example, the layer 16A having fixed charges (fixed charge layer), the dielectric layer 16B having insulation properties, and the inter-layer insulation layer 17 are provided between the first surface 30A of the semiconductor substrate 30 and the lower electrode 11. A protective layer 18 is provided on the upper electrode 15. A light-shielding film 21 is provided in the protective layer 18, for example, above the readout electrode 11A. It is sufficient if this light-shielding film 21A is provided to cover the region of the readout electrode 11A in direct contact with at least the n-type photoelectric conversion layer 14 without overlapping at least the accumulation electrode 11B. For example, it is preferable that the light-shielding film 21 be slightly larger than the readout electrode 11A formed in the same layer as the accumulation electrode 11B. In addition, for example, a color filter 22 is provided, for example, above the accumulation electrode 11B. The color filter 22 prevents, for example, visible light from being inputted to the n-type photoelectric conversion layer 14, and it is sufficient if the color filter 22 is provided to cover at least the region of the accumulation electrode 11B. It is to be noted that FIG. 1 illustrates an example in which the light-shielding film 21 and the color filter 22 are provided at different positions in the film thickness direction of the protective layer 18, but the light-shielding film 21 and the color filter 22 may be provided at the same positions. Optical members such as a flattening layer (not illustrated) and an on-chip lens 23 are disposed above the protective layer 18.

The fixed charge layer 16A may be a film having a positive fixed charge or a film having a negative fixed charge. Materials of the film having a negative fixed charge include hafnium oxide, aluminum oxide, zirconium oxide, tantalum oxide, titanium oxide, and the like. In addition, as a material other than the above-described materials, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, an aluminum nitride film, a hafnium oxynitride film, an aluminum oxynitride film, or the like may be used.

The fixed charge layer 16A may also have a configuration in which two or more types of films are stacked. This makes it possible to further improve a function of a hole accumulation layer in a case of a film having a negative fixed charge, for example.

Materials of the dielectric layer 16B are not limited in particular, but the dielectric layer 16B includes, for example, a silicon oxide film, TEOS, a silicon nitride film, a silicon oxynitride film, or the like.

The inter-layer insulation layer 17 includes, for example, a single-layer film including one of silicon oxide, silicon nitride, silicon oxynitride (SiON), and the like, or a stacked film including two or more thereof.

The protective layer 18 includes a material having light transmissivity, and includes, for example, a single-layer film including any of silicon oxide, silicon nitride, silicon oxynitride, and the like, or a stacked film including two or more thereof. The protective layer 18 has a thickness of 100 nm to 30000 nm, for example.

The through electrode 34 is provided between the first surface 30A and second surface 30B of the semiconductor substrate 30. The photoelectric conversion element 10 is coupled, via this through electrode 34, to a gate Gamp of the amplifier transistor AMP and the one source/drain region 36B of the reset transistor RST (reset transistor Tr1*rst*) also serving as the floating diffusion FD1. This makes it possible in the imaging element 1 to favorably transfer signal charges generated in the photoelectric conversion element 10 on the first surface 30A side of the semiconductor substrate 30 onto the second surface 30B side of the semiconductor substrate 30 via the through electrode 34, and improve characteristics.

The lower end of the through electrode 34 is coupled to the coupling section 41A in the wiring layer 41, and the coupling section 41A and the gate Gamp of the amplifier transistor AMP are coupled via a lower first contact 45. The coupling section 41A and the floating diffusion FD1 (region 36B) are coupled via the lower second contact 46, for example. The upper end of the through electrode 34 is coupled to the readout electrode 11A via the pad section 39A and the upper first contact 17A, for example.

The through electrode 34 has a function of a connector for the photoelectric conversion element 10 and the gate Gamp of the amplifier transistor AMP, and the floating diffusion FD1, and serves as a transmission path for the charges (electrons here) generated in the photoelectric conversion element 10.

A reset gate Grst of the reset transistor RST is disposed next to the floating diffusion FD1 (one source/drain region 36B of the reset transistor RST). This makes it possible to cause the reset transistor RST to reset the charges accumulated in the floating diffusion FD1.

The semiconductor substrate 30 includes, for example, an n-type silicon (Si) substrate, and has a p-well 31 in a predetermined region. The second surface 30B of the p-well 31 is provided with the above-described amplifier transistor AMP, reset transistor RST, selection transistor SEL, and the like. In addition, a peripheral portion of the semiconductor substrate 30 is provided with a peripheral circuit (not illustrated) including a logic circuit or the like.

The reset transistor RST (reset transistor Tr1*rst*) resets the charges transferred from the photoelectric conversion element 10 to the floating diffusion FD1, and includes, for example, an MOS transistor. Specifically, the reset transistor Tr1*rst* includes the reset gate Grst, a channel formation region 36A, and source/drain regions 36B and 36C. The reset gate Grst is coupled to a reset line RST1. One source/drain region 36B of the reset transistor Tr1*rst* also serves as the floating diffusion FD1. The other source/drain region 36C included in the reset transistor Tr1*rst* is coupled to a power supply VDD.

The amplifier transistor AMP is a modulation element that modulates, into a voltage, the amount of charges generated in the photoelectric conversion element 10, and includes, for example, an MOS transistor. Specifically, the amplifier transistor AMP includes the gate Gamp, a channel formation region 35A, and source/drain regions 35B and 35C. The gate Gamp is coupled to the readout electrode 11A and one source/drain region 36B (floating diffusion FD1) of the reset transistor Tr1*rst* via the lower first contact 45, the coupling section 41A, the lower second contact 46, the through electrode 34, and the like. In addition, the one source/drain region 35B shares a region with the other source/drain region 36C included in the reset transistor Tr1*rst*, and is coupled to the power supply VDD.

The selection transistor SEL (selection transistor TR1*sel*) includes a gate Gsel, a channel formation region 34A, and source/drain regions 34B and 34C. The gate Gsel is coupled to a selection line SELL In addition, the one source/drain region 34B shares a region with the other source/drain region 35C included in the amplifier transistor AMP, and the other source/drain region 34C is coupled to a signal line (data output line) VSL1.

The reset line RST1 and the selection line SEL1 are each coupled to a vertical drive circuit 112 included in the drive circuit. The signal line (data output line) VSL1 is coupled to a column signal processing circuit 113 included in the drive circuit.

The lower first contact 45, the upper first contact 17A, an upper second contact 17B, and the upper third contact 17C each include, for example, a doped silicon material such as PDAS (Phosphorus Doped Amorphous Silicon), or a metallic material such as aluminum (Al), tungsten (W), titanium (Ti), cobalt (Co), hafnium (Hf), or tantalum (Ta).

(1-2. Method of Manufacturing Imaging Element)

The imaging element 1 according to the present embodiment is manufacturable as follows, for example.

FIGS. 6A, 6B, 6C, 6D, and 6E each illustrate a method of manufacturing the imaging element 1 in the order of steps. First, as illustrated in FIG. 6A, for example, the p-well 31 is formed in the semiconductor substrate 30 as a first electrically-conductive well. A p+ region is formed near the first surface 30A of the semiconductor substrate 30.

As also illustrated in FIG. 6A, an n+ region serving as the floating diffusion FD1 is formed on the second surface 30B of the semiconductor substrate 30, and a gate insulation layer 32 and a gate wiring layer 47 are then formed. The gate wiring layer 47 includes the respective gates of the selection transistor SEL, amplifier transistor AMP, and reset transistor RST. This forms the selection transistor SEL, the amplifier transistor AMP, and the reset transistor RST. Further, the multilayer wiring line 40 is formed on the second surface 30B of the semiconductor substrate 30. The multilayer wiring line 40 includes the wiring layers 41 to 43 and the insulation layer 44. The wiring layers 41 to 43 include the lower first contact 45, the lower second contact 46, and the coupling section 41A.

As a base of the semiconductor substrate 30, for example, an SOI (Silicon on Insulator) substrate is used in which the semiconductor substrate 30, an embedded oxide film (not illustrated), and a holding substrate (not illustrated) are stacked. The embedded oxide film and the holding substrate are not illustrated in FIG. 6A, but are joined to the first surface 30A of the semiconductor substrate 30. After ion implantation, an annealing process is performed.

Then, a support substrate (not illustrated), another semiconductor base, or the like is joined to the second surface 30B side (multilayer wiring line 40 side) of the semiconductor substrate 30, and flipped vertically. Subsequently, the semiconductor substrate 30 is separated from the embedded oxide film and holding substrate of the SOI substrate to expose the first surface 30A of the semiconductor substrate 30. It is possible to perform these steps with technology used in a normal CMOS process such as ion implantation and CVD (Chemical Vapor Deposition).

The semiconductor substrate 30 is then processed from the first surface 30A side, for example, by dry etching, and an annular opening 34H is formed, for example, as illustrated in FIG. 6B. The depth of the opening 34H extends from the first surface 30A to the second surface 30B of the semiconductor substrate 30 as illustrated in FIG. 6B, and reaches the coupling section 41A, for example.

Subsequently, for example, the negative fixed charge layer 16A is formed on the first surface 30A of the semiconductor substrate 30 and the side surface of the opening 34H. Two or more types of films may be stacked as the negative fixed charge layer 16A. This makes it possible to further improve the function of the hole accumulation layer. The dielectric layer 16B is formed after the negative fixed charge layer 16A is formed. Next, the pad sections 39A, 39B, and 39C are formed at predetermined positions on the dielectric layer 16B, and the inter-layer insulation layer 17 is then formed on the dielectric layer 16B and the pad sections 39A, 39B, and 39C. Subsequently, the inter-layer insulation layer 17 is formed, and the surface of the inter-layer insulation layer 17 is then flattened, for example, by using CMP (Chemical Mechanical Polishing).

Subsequently, openings 18H1, 18H2, and 18H3 are formed in the inter-layer insulation layer 17 on the pad sections 39A, 39B, and 39C, respectively, and these openings 18H1, 18H2, and 18H3 are then filled, for example, with electrically-conductive materials such as Al to form an upper first contact 18A, an upper second contact 18B, and an upper third contact 18C as illustrated in FIG. 6C.

Subsequently, an electrically-conductive film 21x is formed on the inter-layer insulation layer 17, and photoresists PR are then formed at predetermined positions (e.g., on the pad section 39A, the pad section 39B, and the pad section 39C) on the electrically-conductive film 21x as illustrated in FIG. 6D. Thereafter, the readout electrode A, the accumulation electrode 11B, and the transfer electrode 11C illustrated in FIG. 6E are patterned by etching and removing the photoresists PR.

Subsequently, the insulation layer 12 is then formed above the inter-layer insulation layer 17 and the readout electrode 11A, and the accumulation electrode 11B and the upper third contact 18C. Thereafter, the opening 12H is provided on the readout electrode 11A. Thereafter, the semiconductor layer 13, the n-type photoelectric conversion layer 14, the upper electrode 15, the protective layer 18, the light-shielding film 21, and the color filter 22 are formed above the inter-layer insulation layer 17. Lastly, the optical members such as the flattening layer and the on-chip lens 23 are disposed. As described above, the imaging element 1 illustrated in FIG. 1 is completed.

(1-3. Method of Controlling Imaging Element)

(Acquisition of Signal by Photoelectric Conversion Element 10)

In the imaging element 1 according to the present embodiment, the light in the near-infrared region in light inputted to the imaging element 1 is selectively detected (absorbed) and subjected to photoelectric conversion by the photoelectric conversion element 10.

The photoelectric conversion element 10 is coupled to the gate Gamp of the amplifier transistor AMP and the floating diffusion FD1 via the through electrode 34. Therefore, the electrons (signal charges) of the electron-hole pairs generated at the photoelectric conversion element 10 are drawn out from the lower electrode 11 side, transferred onto the second surface 30B side of the semiconductor substrate 30 via the through electrode 34, and accumulated in the floating diffusion FD1. At the same time as this, the amplifier transistor AMP modulates the amount of charges generated in the photoelectric conversion element 10 into a voltage.

In addition, the reset gate Grst of the reset transistor RST is disposed next to the floating diffusion FD1. This causes the reset transistor RST to reset the charges accumulated in the floating diffusion FD1.

In the present embodiment, the photoelectric conversion element 10 is coupled to not only the amplifier transistor AMP, but also the floating diffusion FD1 via the through electrode 34, making it possible to facilitate the reset transistor RST to reset the charges accumulated in the floating diffusion FD1.

In contrast, in a case where the through electrode 34 and the floating diffusion FD1 are not coupled, it is difficult to reset the charges accumulated in the floating diffusion FD1, resulting in application of a large voltage to pull out the charges to the upper electrode 15 side. The n-type photoelectric conversion layer 14 may be thus damaged. In addition, a structure that enables resetting in a short period of time leads to increased dark-time noise and results in a trade-off. This structure is thus difficult.

FIGS. 7A, 7B, and 7C illustrate an operation example of the photoelectric conversion element 10. FIG. 7A indicates a potential at the accumulation electrode 11B, FIG. 7B indicates a potential at the floating diffusion FD1 (readout electrode 11A), and FIG. 7C indicates a potential at the gate (Gsel) of the reset transistor TR1rst. In the photoelectric conversion element 10, respective voltages are individually applied to the readout electrode 11A, the accumulation electrode 11B, and the transfer electrode 11C.

In the photoelectric conversion element 10, a potential V1 is applied to the readout electrode 11A from the drive circuit, and a potential V2 is applied to the accumulation electrode 11B in an accumulation period. Here, it is assumed that the potentials V1 and V2 satisfy V1>V2. This causes signal charges (electrons here) generated by photoelectric conversion to be attracted to the accumulation electrode 11B and accumulated in the region of the semiconductor layer 13 opposed to the accumulation electrode 11B (accumulation period). Incidentally, the potential of the region of the semiconductor layer 13 opposed to the accumulation electrode 11B has a value that is more positive with the passage of time of photoelectric conversion. It is to be noted that holes are sent from the upper electrode 15 to the drive circuit.

In the photoelectric conversion element 10, a reset operation is performed in the latter half of the accumulation period. Specifically, at timing t1, a scanning section changes the voltage of a reset signal RST from a low level to a high level. This turns on the reset transistor TR1rst in the unit pixel P. As a result, the voltage of the floating diffusion FD1 is set at a power supply voltage VDD, and the voltage of the floating diffusion FD1 is reset (reset period).

After the reset operation is completed, the charges are read out. Specifically, at timing t2, a potential V3 is applied to the readout electrode 11A from the drive circuit, a potential V4 is applied to the accumulation electrode 11B, and a potential V5 is applied to the transfer electrode 11C. Here, it is assumed that the potentials V3, V4, and V5 satisfy V4>V5>V3. This causes the signal charges accumulated in the region corresponding to the accumulation electrode 11B to move from the accumulation electrode 11B to the transfer electrode 11C and the readout electrode 11A in sequence, and be read out from the readout electrode 11A to the floating diffusion FD1. That is, the charges accumulated in the semiconductor layer 13 are read out to the control section (transfer period).

After a readout operation is finished, the potential V1 is applied to the readout electrode 11A from the drive circuit, and the potential V2 is applied to the accumulation electrode 11B again. This causes the signal charges generated by photoelectric conversion to be attracted to the accumulation electrode 11B and accumulated in the region of the semiconductor layer 13 opposed to the accumulation electrode 11B (accumulation period).

(1-4. Workings and Effects)

As described above, a photoelectric conversion element in which a semiconductor nanoparticle is used for a photoelectric conversion layer has been recently developed as a photoelectric conversion element having a sensitivity to near-infrared light. The photoelectric conversion element in which a semiconductor nanoparticle is used for the photoelectric conversion layer is provided with a semiconductor layer between the lower electrode and the photoelectric conversion layer, for example, like a photoelectric conversion element 1000 illustrated in FIG. 8 from the perspective of reset noise. The semiconductor layer accumulates the charges generated in the photoelectric conversion layer on a charge accumulating electrode included in the lower electrode, and transfers the accumulated charges to a charge collecting electrode. The semiconductor layer is formed, for example, by using an oxide semiconductor material such as IGZO, which has a high charge mobility. The photoelectric conversion element in which the semiconductor layer and the photoelectric conversion layer including a semiconductor nanoparticle are stacked, however, has concerns about increased dark currents and decreased quantum efficiency.

FIG. 8 illustrates potential distribution between electrodes when a typical photoelectric conversion element is irradiated with light. A horizontal axis in FIG. 8 indicates a distance from an interface between an electrode disposed at a light incidence side and a photoelectric conversion layer. Thus, a film thickness of 0 nm corresponds to an interface with the electrode disposed at the light incidence side, a film thickness of 300 nm corresponds to an interface with an electrode disposed on the other side of the light incidence side, and a film thickness of 200 nm corresponds to an interface between the photoelectric conversion layer and the semiconductor layer. Solid lines in FIG. 8 represent potential distribution between electrodes of a photoelectric conversion element including a semiconductor layer having a dielectric constant of 10 and an intrinsic photoelectric conversion layer having a dielectric constant of 30 at a donor density $(N_D)$ of $10^{15}$ cm$^{-3}$, for example. Dashed lines in FIG. 9 represents potential distribution between electrodes of a photoelectric conversion element including a semiconductor layer having a dielectric constant of 10 and an intrinsic photoelectric conversion layer having a dielectric constant of 30 at a donor density $(N_D)$ of $10^{18}$ cm$^{-3}$, for example. In the typical photoelectric conversion element, as illustrated in FIG. 9, it is appreciated that the energy change in the range of 0 nm to 200 nm corresponding to the photoelectric conversion layer is small compared to the energy change in the range of 200 nm to 300 nm corresponding to the semiconductor layer, and an inner electric field applied to the photoelectric conversion layer when irradiated with light is weak. Further, it is appreciated that the lower the carrier density (donor density) of the semiconductor layer to be bonded, the harder it is to apply the inner electric field to the photoelectric conversion layer when irradiated with light.

It is known that quantum efficiency of photoelectric conversion element is increased by stacking an n-type semiconductor layer and a photoelectric conversion layer. In contrast, in a photoelectric conversion element in which a plurality of independent electrodes is provided on the opposite side to a light incidence side to cause charges generated by photoelectric conversion to be accumulated in the semiconductor layer, it is necessary that the semiconductor layer be depleted for accumulation and transfer operation of the charges. Stacking of the depleted semiconductor layer and the photoelectric conversion layer makes it less likely that the inner electric field is applied to the photoelectric conversion layer as illustrated in FIG. 8 due to the difference in the dielectric constants between the depleted semiconductor layer and the photoelectric conversion layer. Therefore, the transfer of charges comes to depend on diffusion conduction, and the quantum efficiency is reduced.

In contrast, in the photoelectric conversion element (photoelectric conversion element 10) according to the present embodiment, the n-type photoelectric conversion layer 14 that is n-type doped is provided as the photoelectric conversion layer. FIG. 9 illustrates potential distribution between electrodes when the photoelectric conversion element 10 is irradiated with light. A horizontal axis in FIG. 9 indicates, as in FIG. 8, indicates a distance from an interface between the electrode (upper electrode 15) disposed at the light incidence side and the photoelectric conversion layer (n-type photoelectric conversion layer 14). Thus, a film thickness of 0 nm corresponds to an interface with the upper electrode 15, a film thickness of 300 corresponds to an interface with the lower electrode 11, and a film thickness of 200 nm corresponds to an interface between the n-type photoelectric conversion layer 14 and the semiconductor layer 13. Solid lines in FIG. 9 represent potential distribution between electrodes of the photoelectric conversion element including the photoelectric conversion layer according to the present embodiment. Dashed lines in FIG. 9 represents potential distribution between electrodes of the photoelectric conversion element including the intrinsic photoelectric conversion layer illustrated in FIG. 8 serving as a comparative example. It is to be noted that the respective semiconductor layers used in the both photoelectric conversion elements each have a donor density ($N_D$) of $10^{15}$ cm$^{-3}$. In the photoelectric conversion element 10 according to the present embodiment, as illustrated in FIG. 9, it is appreciated that a strong inner electric field is applied to the n-type photoelectric conversion layer 14 when irradiated with light as compared to the comparative example. Therefore, the efficiency is increased of transporting electrons generated in the n-type photoelectric conversion layer 14 to the accumulation electrode 11B, and it becomes possible to suppress recombination of electron-hole pairs in the n-type photoelectric conversion layer 14.

As described above, in the present embodiment, the n-type photoelectric conversion layer 14 is stacked as a photoelectric conversion layer on the semiconductor layer 13 provided on the lower electrode 11 including the plurality of electrodes independent from each other; therefore, a strong electric field is applied to the n-type photoelectric conversion layer 14. This is because as a result of electrons in the n-type photoelectric conversion layer 14 diffusing into the semiconductor layer 13, positive space charges are formed in the n-type photoelectric conversion layer 14 in the vicinity of the bonding surface, and the potential energy of the n-type photoelectric conversion layer 14 is depressed. Therefore, the recombination of charges in the n-type photoelectric conversion layer 14 is suppressed, and it becomes possible to increase the quantum efficiency.

2. Application Examples

Application Example 1

FIG. 10 illustrates the overall configuration of an imaging device (imaging device 100) including the imaging element 1 described in the above-described embodiment for each pixel. This imaging device 100 is a CMOS image sensor, and includes a pixel section 1a as an imaging area and a peripheral circuit section 130 in a peripheral region of this pixel section 1a on the semiconductor substrate 30. The peripheral circuit section 130 includes, for example, a row scanner 131, a horizontal selector 133, a column scanner 134, and a system controller 132.

The pixel section 1a includes, for example, the plurality of unit pixels P two-dimensionally disposed in a matrix. In these unit pixels P, pixel drive lines Lread (specifically, a row selection line and a reset control line) are disposed in each of pixel rows, for example, and vertical signal lines Lsig are disposed in each of pixel columns. The pixel drive lines Lread are each used to transmit drive signals for reading out signals from pixels. One end of each of the pixel drive lines Lread is coupled to the output end of the row scanner 131 corresponding to each row.

The row scanner 131 is a pixel driver that includes a shift register, an address decoder, and the like, and drives each of the unit pixels P of the pixel section 1a on a row basis, for example. A signal outputted from each of the unit pixels P of the pixel rows selectively scanned by the row scanner 131 is supplied to the horizontal selector 133 through each of the vertical signal lines Lsig. The horizontal selector 133 includes an amplifier, a horizontal selection switch, and the like provided for each of the vertical signal lines Lsig.

The column scanner 134 includes a shift register, an address decoder, and the like, and drives each of the horizontal selection switches of the horizontal selector 133 in sequence while scanning the horizontal selection switches. The selective scanning by this column scanner 134 causes the signals of the respective pixels transmitted through the respective vertical signal lines Lsig to be outputted in sequence to a horizontal signal line 135, and transmitted to the outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in external control IC. In addition, those circuit components may be formed on another substrate coupled by a cable or the like.

The system controller 132 receives a clock supplied from the outside of the semiconductor substrate 30, data on instructions of operation modes, and the like, and outputs data such as internal information of the imaging device 100. The system controller 132 further includes a timing generator that generates various timing signals, and controls the driving of the peripheral circuits such as the row scanner 131, the horizontal selector 133, and the column scanner 134 on the basis of the various timing signals generated by the timing generator.

Application Example 2

The above-described imaging device 100 or the like is applicable, for example, to any type of electronic apparatuses each having an imaging function such as a camera system including a digital still camera, a video camera, or the like, and a mobile phone having an imaging function. FIG. 11 illustrates the schematic configuration of an electronic apparatus 200 (camera) as an example thereof. This electronic apparatus 200 is, for example, a video camera that is able to shoot a still image or a moving image. The electronic apparatus 200 includes the imaging device 100, an optical system (optical lens) 210, a shutter device 211, a drive section 213 that drives the imaging device 100 and the shutter device 211, and a signal processing section 212.

The optical system 210 guides image light (incident light) from a subject to the pixel section 1a of the imaging device 100. This optical system 210 may include a plurality of optical lenses. The shutter device 211 controls periods for irradiating the imaging device 100 with light and shielding the imaging device 100 from light. The drive section 213 controls a transfer operation of the imaging device 100 and a shutter operation of the shutter device 211. The signal processing section 212 performs various kinds of signal processing on a signal outputted from the imaging device 100. An image signal Dout subjected to the signal processing is stored in a storage medium such as a memory or outputted to a monitor or the like.

Application Example 3

<Example of Practical Application to In-Vivo Information Acquisition System>

Further, the technology (present technology) according to the present disclosure is applicable to various products. For example, the technology according to the present disclosure may be applied to an endoscopic surgery system.

FIG. 12 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 12, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112)

can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This makes it possible to increase the detection accuracy.

Application Example 4

<Example of Practical Application to Endoscopic Surgery System>

The technology (present technology) according to the present disclosure is applicable to various products. For example, the technology according to the present disclosure may be applied to an endoscopic surgery system.

FIG. 13 is a view depicting an example of a schematic configuration of an endoscopic surgery system to which the technology according to an embodiment of the present disclosure (present technology) can be applied.

In FIG. 13, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 14 is a block diagram depicting an example of a functional configuration of the camera head 11102 and the CCU 11201 depicted in FIG. 13.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to the image pickup unit 11402 among the components described above. Applying the technology according to an embodiment of the present disclosure to the image pickup unit 11402 increases the detection accuracy.

It is to be noted that the endoscopic surgery system has been described here as an example, but the technology according to the present disclosure may be additionally applied to, for example, a microscopic surgery system or the like.

Application Example 5

<Example of Practical Application to Mobile Body>

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

3. Working Examples

Next, working examples of the present disclosure are described in detail.

A sample for evaluation was fabricated by using the following method, and the quantum efficiency (QE) and responsiveness were evaluated.

First, a glass substrate having a film thickness of 50 nm provided with an ITO electrode was washed by UV/ozone treatment, and thereafter, a semiconductor layer including IGZO and having a thickness of 100 nm was formed by sputtering on the ITO electrode. Subsequently, this substrate was subjected to heat treatment for one hour at 350° C., in the atmosphere to deplete the IGZO. Next, ink was applied by spin coating onto the semiconductor layer as a photoelectric conversion layer at a rotation speed of 2500 rpm. The ink was obtained by dispersing PbS nanoparticles in an octane solvent at a concentration of 50 mg/ml. Oleic acid was coordinated to each of the PbS nanoparticles on the nanoparticle surface. Subsequently, a solution was dripped under the atmosphere that was obtained by dispersing TBAI (tetrabutylammonium iodide) in a methanol solvent at a concentration of 0.1 vol %, immersion treatment was performed for 10 seconds, and a ligand exchange was made from the oleic acid to the TBAI. Next, methanol was dripped to wash off excess organic substances such as oleic acid. This operation was repeated ten times to form a photoelectric conversion layer having a thickness of approximately 300 nm. After the layer formation, heat treatment was performed for five minutes at 120° C. in an inactive gas atmosphere to remove a residual solvent. Subsequently, an $MoO_3$ film having a thickness of 10 nm was formed by vacuum deposition on the photoelectric conversion layer, and an ITO film of 50 nm was then stacked by sputtering to form an upper electrode. As described above, a photoelectric conversion element (sample 1) including a photoelectric conversion region of 1 mm×1 mm was fabricated.

A carrier density and a polarity of the photoelectric conversion layer obtained above were estimated from gate voltage-drain current characteristics and drain voltage-drain current characteristics of a thin-film transistor having, as an active layer, a photoelectric conversion layer fabricated separately using a similar method. The thin-film transistor had a gate electrode using Al on a glass substrate, a gate insulation film in which an $Al_2O_3$ surface is modified with trichlorooctadecylsilane, and was fabricated by forming, as the active layer, the photoelectric conversion layer using a similar method as the photoelectric conversion element, and Al was used as a source/drain electrode. The photoelectric conversion layer of sample 1 thus obtained was p-type, and the carrier density thereof was $p=1\times10^{16}$ $cm^{-3}$.

In addition, as samples 2 to 6, photoelectric conversion elements having n-type photoelectric conversion layers differing in carrier density were fabricated. Specifically, a solution in which TBAI or TBAB (tetrabutylammonium bromide) was dispersed in a methanol solvent at a concentration of 0.1 vol % to 5 vol % was dripped under an inert atmosphere, and immersion time was adjusted in a range of 10 seconds to 200 seconds to thereby fabricate samples each having corresponding one of the carrier densities of $n=3\times10^{16}$ $cm^{-3}$ (sample 2), $n=1\times10^{17}$ $cm^{-3}$ (sample 3), $n=4\times10^{17}$ $cm^{-3}$ (sample 4), $n=7\times10^{17}$ $cm^{-3}$ (sample 5), and $n=1\times10^{18}$ $cm^{-3}$ (sample 6). It is to be noted that the method of fabricating a sample after the ligand exchange is similar to sample 1.

FIG. 17 is a characteristic diagram summarizing a relationship between the carrier density and the quantum efficiency of the photoelectric conversion layer using samples 1 to 6 described above. It is to be noted that the vertical axis of FIG. 17 indicates a relative value in which the quantum efficiency of sample 1 having the p-type photoelectric conversion layer is set to 1. From FIG. 17, it was confirmed that in the photoelectric conversion element including the semiconductor nanoparticle, the quantum efficiency was increased by providing the n-type photoelectric conversion layer on the semiconductor layer. Further, it was appreciated that the carrier density of the n-type photoelectric conversion layer is preferably set to $n=3\times10^{16}$ $cm^{-3}$ or more and $1\times10^{18}$ $cm^{-3}$ or less, and more preferably set to $1\times10^{17}$ $cm^{-3}$ or more and $7\times10^{17}$ $cm^{-3}$ or less. It is noted that the decrease in the quantum efficiency when doping concentration was set to $7\times10^{17}$ $cm^{-3}$ or more is considered to be due to that the n-type photoelectric conversion layer in the vicinity of the bonding surface between the n-type photoelectric conversion layer and the semiconductor layer is strongly depleted by positive fixed charges, thereby causing the electron density in the photoelectric conversion layer to be excessive, weakening the inner electric field of the photoelectric conversion layer, and promoting the recombination of charges.

The above has given description with reference to the embodiment, the application examples, and the working examples, but the content of the present disclosure is not limited to the above-described embodiment and the like, and various modifications are possible. For example, in the above-described embodiment, the example has been described in which the photoelectric conversion element 10 is used alone in the imaging element 1. The photoelectric conversion element 10 performs photoelectric conversion on the light having the wavelength of the near-infrared region. However, for example, another photoelectric conversion element may be combined and used that performs photoelectric conversion on light such as visible light having the wavelength of a region other than the near-infrared region. Examples of the other photoelectric conversion element include a so-called inorganic photoelectric conversion element embedded and formed in the semiconductor substrate 30, and a so-called organic photoelectric conversion element in which a photoelectric conversion layer is formed by using an organic semiconductor material.

In addition, in the above-described embodiment and the like, the configuration of the back-illuminated imaging element 1 is described as an example. However, it is also possible to apply the embodiment and the like to a front-illuminated imaging element. Further, in a case where another photoelectric conversion element is combined and used as described above, the imaging element 1 may be configured as a so-called vertical spectral type imaging element or may be an imaging element including a semiconductor substrate on which photoelectric conversion elements that perform photoelectric conversion on the light within another wavelength range are two-dimensionally arranged (e.g., Bayer arrangement). Furthermore, for example, a substrate provided with another functional device such as a memory element may be stacked on the multilayer wiring side.

In addition, the photoelectric conversion element 10, and imaging element 1 and imaging device 100 according to the present disclosure each do not necessarily have to include all of the respective components described in the above-described embodiment and the like, but may include another layer on the contrary.

Furthermore, it is possible to apply the technology according to the disclosure to a photovoltaic cell, for example, in addition to the imaging device.

It is to be noted that the effects described herein are merely examples, but not limitative. In addition, there may be other effects.

It is to be noted that the present disclosure may have the following configurations.

(1)
A photoelectric conversion element including:
a first electrode including a plurality of electrodes independent from each other;
a second electrode disposed to be opposed to the first electrode;
an n-type photoelectric conversion layer including a semiconductor nanoparticle, the n-type photoelectric conversion layer being provided between the first electrode and the second electrode; and
a semiconductor layer including an oxide semiconductor material, the semiconductor layer being provided between the first electrode and the n-type photoelectric conversion layer.

(2)
The photoelectric conversion element according to (1), in which the n-type photoelectric conversion layer has a carrier density of $3\times10^{16}$ cm$^{-3}$ or more and $1\times10^{18}$ cm$^{-3}$ or less.

(3)
The photoelectric conversion element according to (1) or (2), in which the semiconductor layer has a carrier density of $1\times10^{17}$ cm$^{-3}$ or less.

(4)
The photoelectric conversion element according to any one of (1) to (3), in which
the semiconductor nanoparticle includes a core and a ligand, the ligand being bound to a surface of the core, and
the core includes at least one of PbS, PbSe, PbTe, CuInSe$_2$, ZnCuInSe, CuInS$_2$, HgTe, InAs, InSb, Ag$_2$S, or CuZnSnSSe.

(5)
The photoelectric conversion element according to any one of (1) to (4), in which
the semiconductor nanoparticle includes a core and a ligand, the ligand being bound to a surface of the core, and
the ligand includes any of a chlorine atom, a bromine atom, and an iodine atom.

(6)
The photoelectric conversion element according to (4) or (5), in which
the semiconductor nanoparticle further includes a shell provided around the core, and
the shell includes at least one of PbO, PbO$_2$, Pb$_3$O$_4$, ZnS, ZnSe, and ZnTe.

(7)
The photoelectric conversion element according to any one of (1) to (6), in which the semiconductor layer includes at least one of IGZO, ZTO, Zn$_2$SnO$_4$, InGaZnSnO, GTO, Ga$_2$O$_3$:SnO$_2$, or IGO.

(8)
The photoelectric conversion element according to any one of (1) to (7), in which
the first electrode is formed by using any of titanium (Ti), silver (Ag), aluminum (Al), magnesium (Mg), chromium (Cr), nickel (Ni), tungsten (W), and copper (Cu), and
the second electrode is formed by using indium tin oxide (ITO).

(9)
The photoelectric conversion element according to any one of (1) to (8), including
an insulation layer between the first electrode and the semiconductor layer, in which
the first electrode includes a charge readout electrode and a charge accumulation electrode, the charge readout electrode being electrically coupled to the n-type photoelectric conversion layer via an opening provided to the insulation layer, the charge accumulation electrode being disposed to be opposed to the n-type photoelectric conversion layer with the insulation layer interposed therebetween.

(10)
The photoelectric conversion element according to (9), in which the first electrode includes a charge transfer electrode between the charge readout electrode and the charge accumulation electrode.

(11)
The photoelectric conversion element according to any one of (1) to (10), in which respective voltages are individually applied to the plurality of electrodes included in the first electrode.

(12)
The photoelectric conversion element according to any one of (1) to (11), further including
a semiconductor substrate, in which
the first electrode, the semiconductor layer, the n-type photoelectric conversion layer, and the second electrode are provided in this order on a first surface side of the semiconductor substrate.

(13)
The photoelectric conversion element according to (12), in which the semiconductor substrate includes a drive circuit, and the plurality of electrodes included in the first electrode is each coupled to the drive circuit.

(14)
The photoelectric conversion element according to (12) or (13), in which a multilayer wiring layer is formed on a second surface side opposed to the first surface of the semiconductor substrate.

(15)
An imaging device including
a plurality of pixels each provided with one or more photoelectric conversion elements,
the one or more photoelectric conversion elements each including
a first electrode including a plurality of electrodes independent from each other,
a second electrode disposed to be opposed to the first electrode,
an n-type photoelectric conversion layer including a semiconductor nanoparticle, the n-type photoelectric conversion layer being provided between the first electrode and the second electrode, and a semiconductor layer including an oxide semiconductor material, the semiconductor layer being provided between the first electrode and the n-type photoelectric conversion layer.

This application claims the benefit of Japanese Priority Patent Application JP2018-015406 filed with the Japan Patent Office on Jan. 31, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion element, comprising:
  a first electrode including a plurality of electrodes independent from each other;
  a second electrode disposed to be opposed to the first electrode;
  an n-type photoelectric conversion layer including a semiconductor nanoparticle, the n-type photoelectric conversion layer being provided between the first electrode and the second electrode;
  a semiconductor layer including an oxide semiconductor material, the semiconductor layer being provided between the first electrode and the n-type photoelectric conversion layer,
    wherein a carrier density of the n-type photoelectric conversion layer is higher than a carrier density of the semiconductor layer; and
    an insulation layer provided between the first electrode and the semiconductor layer,
    wherein the first electrode includes a charge readout electrode and a charge accumulation electrode, the charge readout electrode being electrically coupled to the n-type photoelectric conversion layer via an opening provided to the insulation layer, and the charge accumulation electrode being disposed to be opposed to the n-type photoelectric conversion layer with the insulation layer interposed therebetween.

2. The photoelectric conversion element according to claim 1, wherein the n-type photoelectric conversion layer has the carrier density of $3\times10^{16}$ cm$^{-3}$ or more and $1\times10^{18}$ cm$^{-3}$ or less.

3. The photoelectric conversion element according to claim 1, wherein the semiconductor layer has a carrier density of $1\times10^{17}$ cm$^{-3}$ or less.

4. The photoelectric conversion element according to claim 1, wherein
  the semiconductor nanoparticle includes a core and a ligand, the ligand being bound to a surface of the core, and
  the core includes at least one of PbS, PbSe, PbTe, CuInSe$_2$, ZnCuInSe, CuInS$_2$, HgTe, InAs, InSb, Ag$_2$S, or CuZnSnSSe.

5. The photoelectric conversion element according to claim 1, wherein
  the semiconductor nanoparticle includes a core and a ligand, the ligand being bound to a surface of the core, and
  the ligand includes any of a chlorine atom, a bromine atom, and an iodine atom.

6. The photoelectric conversion element according to claim 4, wherein
  the semiconductor nanoparticle further includes a shell provided around the core, and
  the shell includes at least one of PbO, PbO$_2$, Pb$_3$O$_4$, ZnS, ZnSe, and ZnTe.

7. The photoelectric conversion element according to claim 1, wherein the semiconductor layer includes at least one of IGZO, ZTO, Zn$_2$SnO$_4$, InGaZnSnO, GTO, Ga$_2$O$_3$:SnO$_2$, or IGO.

8. The photoelectric conversion element according to claim 1, wherein
  the first electrode is formed by using any of titanium (Ti), silver (Ag), aluminum (Al), magnesium (Mg), chromium (Cr), nickel (Ni), tungsten (W), and copper (Cu), and
  the second electrode is formed by using indium tin oxide (ITO).

9. The photoelectric conversion element according to claim 1, wherein the first electrode includes a charge transfer electrode between the charge readout electrode and the charge accumulation electrode.

10. The photoelectric conversion element according to claim 1, wherein respective voltages are individually applied to the plurality of electrodes included in the first electrode.

11. The photoelectric conversion element according to claim 1, further comprising a semiconductor substrate,
  wherein the first electrode, the semiconductor layer, the n-type photoelectric conversion layer, and the second electrode are provided in this order on a first surface side of the semiconductor substrate.

12. The photoelectric conversion element according to claim 11, wherein the semiconductor substrate includes a drive circuit, and the plurality of electrodes included in the first electrode is each coupled to the drive circuit.

13. The photoelectric conversion element according to claim 11, wherein a multilayer wiring layer is formed on a second surface side opposed to the first surface side of the semiconductor substrate.

14. The photoelectric conversion element according to claim 1, wherein a carrier mobility of the semiconductor layer is higher than a carrier mobility of the n-type photoelectric conversion layer.

15. An imaging device, comprising
  a plurality of pixels each provided with one or more photoelectric conversion elements, the one or more photoelectric conversion elements each including:
    a first electrode including a plurality of electrodes independent from each other,
    a second electrode disposed to be opposed to the first electrode,
    an n-type photoelectric conversion layer including a semiconductor nanoparticle, the n-type photoelectric conversion layer being provided between the first electrode and the second electrode,
    a semiconductor layer including an oxide semiconductor material, the semiconductor layer being provided between the first electrode and the n-type photoelectric conversion layer,
      wherein a carrier density of the n-type photoelectric conversion layer is higher than a carrier density of the semiconductor layer; and
    an insulation layer provided between the first electrode and the semiconductor layer,
      wherein the first electrode includes a charge readout electrode and a charge accumulation electrode, the charge readout electrode being electrically coupled to the n-type photoelectric conversion layer via an opening provided to the insulation layer, and the charge accumulation electrode being disposed to be opposed to the n-type photoelectric conversion layer with the insulation layer interposed therebetween.

\* \* \* \* \*